United States Patent
Ito

(10) Patent No.: US 8,988,947 B2
(45) Date of Patent: Mar. 24, 2015

(54) BACK BIAS DURING PROGRAM VERIFY OF NON-VOLATILE STORAGE

(71) Applicant: SanDisk Technologies Inc., Plano, TX (US)

(72) Inventor: Fumitoshi Ito, Yokohama (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/213,400

(22) Filed: Mar. 14, 2014

(65) Prior Publication Data

US 2014/0286101 A1    Sep. 25, 2014

Related U.S. Application Data

(60) Provisional application No. 61/804,935, filed on Mar. 25, 2013.

(51) Int. Cl.
  *G11C 11/4197*  (2006.01)
  *G11C 16/34*  (2006.01)
  *G11C 16/04*  (2006.01)
  *G11C 16/10*  (2006.01)
  *G11C 11/56*  (2006.01)

(52) U.S. Cl.
  CPC ........ *G11C 16/3459* (2013.01); *G11C 16/0483* (2013.01); *G11C 16/10* (2013.01); *G11C 11/5628* (2013.01)
  USPC ............ 365/185.27; 365/185.18; 365/185.09; 365/185.22

(58) Field of Classification Search
  USPC .............. 365/185.18, 185.09, 185.27, 185.22
  See application file for complete search history.

(56) References Cited

U.S. PATENT DOCUMENTS

| | | | |
|---|---|---|---|
| 7,468,920 B2 | 12/2008 | Sekar et al. | |
| 7,724,577 B2 | 5/2010 | Goda et al. | |
| 8,000,146 B2 | 8/2011 | Sekar et al. | |
| 8,164,957 B2 | 4/2012 | Sekar et al. | |
| 8,441,853 B2 | 5/2013 | Li | |
| 8,638,606 B2 | 1/2014 | Zhao et al. | |
| 2005/0111260 A1 | 5/2005 | Nazarian | |
| 2007/0253272 A1 | 11/2007 | Shibata | |
| 2008/0198660 A1 | 8/2008 | Mokhlesi | |
| 2011/0157997 A1 | 6/2011 | Kamigaichi et al. | |
| 2013/0077408 A1* | 3/2013 | Ueno | 365/185.22 |
| 2013/0107627 A1 | 5/2013 | Toyama et al. | |

OTHER PUBLICATIONS

International Search Report & The Written Opinion of the International Searching Authority dated Sep. 29, 2014, International Application No. PCT/US2014/031524.

* cited by examiner

*Primary Examiner* — Hoai V Ho
*Assistant Examiner* — Jay Radke
(74) *Attorney, Agent, or Firm* — Vierra Magen Marcus LLP

(57) ABSTRACT

Different back bias (or body bias) conditions are applied to a non-volatile storage system during different program verify operations of a programming operation. A back bias may be applied during verify of an intermediate state (e.g., a lower page, middle page). The intermediate state is a state that exists during a program operation, but is not one of the final states. A lower back bias or no back bias is applied during verify of a final state (e.g., an upper page). Thus, a different back bias may be used when verifying an intermediate state than the back bias used when verifying a final state. Using the back bias makes it easier to verify a low $V_{TH}$, such as a negative $V_{TH}$. Also, using the back bias is effective at dealing with sense amplifier headroom issues.

20 Claims, 20 Drawing Sheets

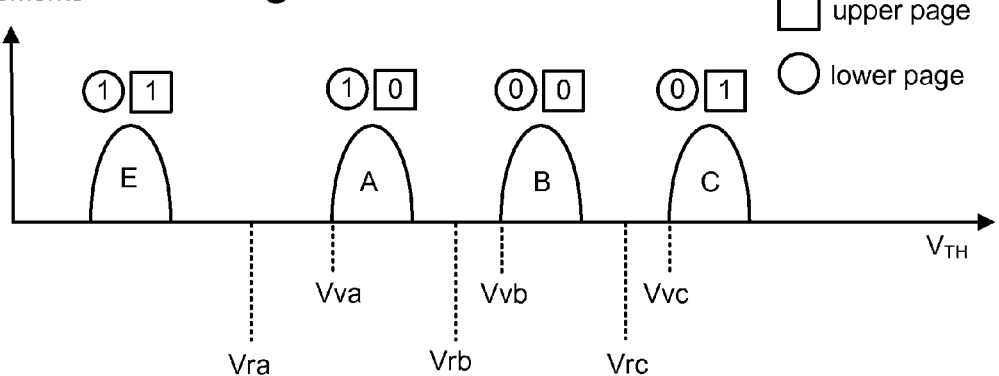
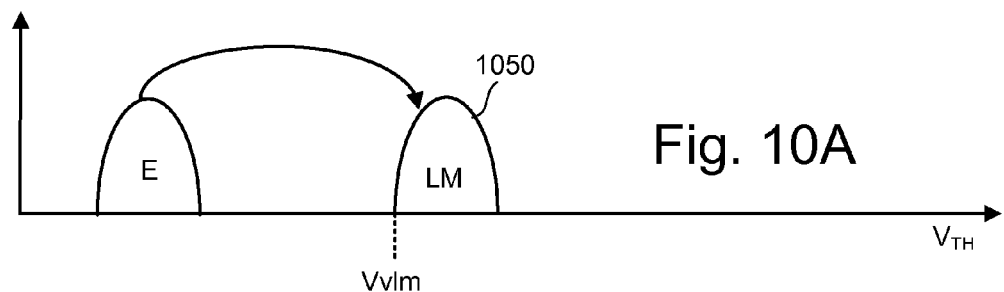
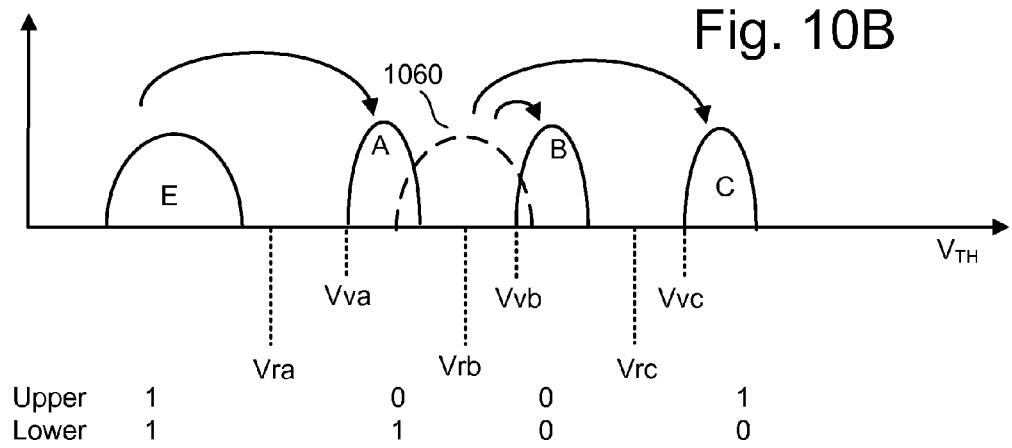

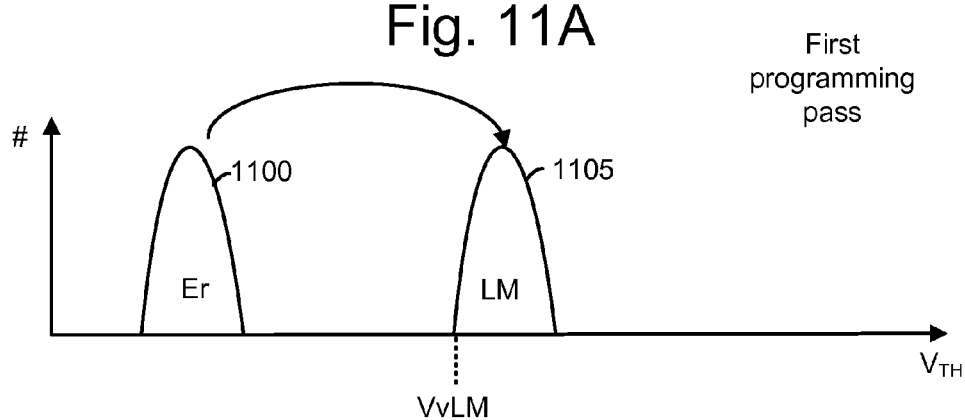
Fig. 11A — First programming pass
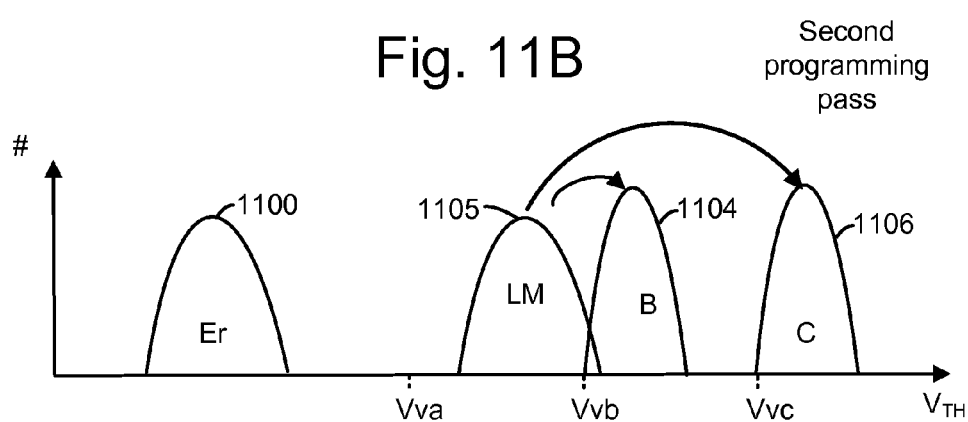
Fig. 11B — Second programming pass
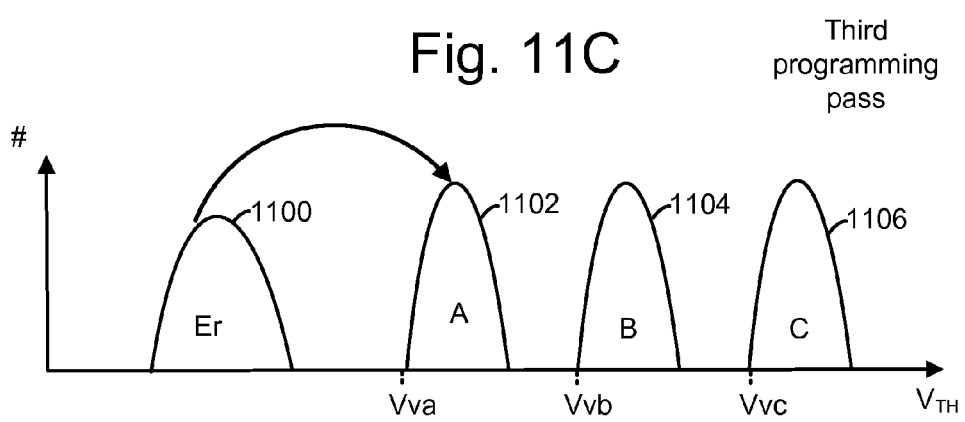
Fig. 11C — Third programming pass

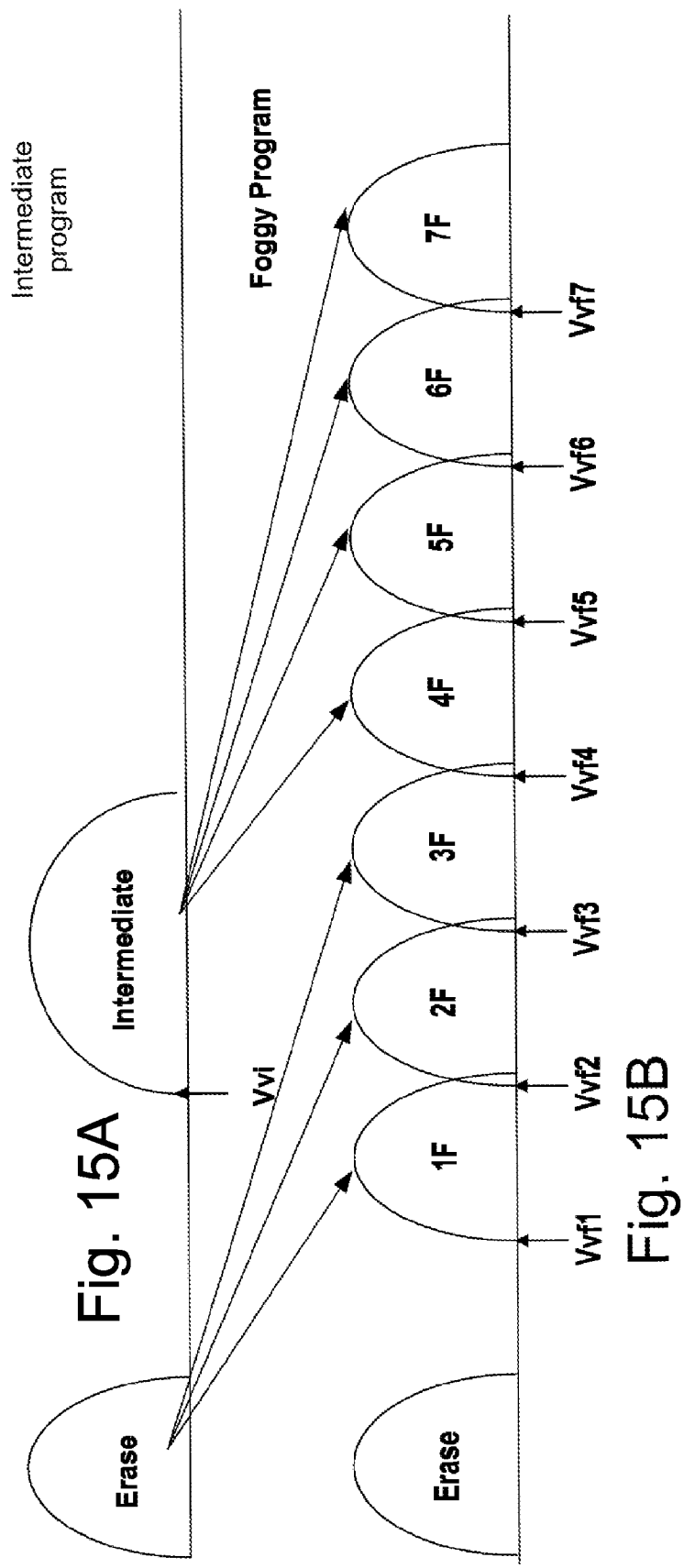

2100

Program a group of non-volatile storage elements to intermediate state and to a final state   2102

2102

Apply a back bias when verifying the intermediate state   2104

Apply less or no back bias when verifying the final state   2106

BACK BIAS DURING PROGRAM VERIFY OF NON-VOLATILE STORAGE

PRIORITY

This application claims the benefit of U.S. Provisional Application No. 61/804,935, entitled, "VERIFY METHOD FOR LOWER AND UPPER PAGE PROGRAMMING," filed on Mar. 25, 2013, which is incorporated herein by reference.

BACKGROUND

The present disclosure relates to technology for non-volatile storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Some non-volatile memory utilizes a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Some flash memory devices have a storage region (e.g., floating gate, charge trapping layer) that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying more than two distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges. As another example, each memory element can store three bits of data when the element can be placed in one of eight discrete charge bands corresponding to eight distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

BRIEF DESCRIPTION OF THE DRAWINGS

FIG. 9 depicts an example set of threshold voltage distributions following a program operation.

FIGS. 10A-10B disclose a programming sequence that first programs a lower page, followed by an upper page.

FIGS. 11A-11C depict one embodiment of a three pass programming sequence.

FIG. 15A-15B depict another embodiment of foggy/fine programming.

FIG. 21 shows a flowchart of one embodiment of a process of applying back bias when verifying an intermediate state.

DETAILED DESCRIPTION

The present disclosure provides a method and system for operating non-volatile storage in which a back bias (also referred to as body bias) is applied during verify of an intermediate state (e.g., a lower page, middle page). The intermediate state is a state that exists during a program operation, but is not one of the final states. The intermediate state is tested by a verify level that is not one of the final verify levels, in one embodiment. A lower back bias or no back bias is applied during verify of a final state (e.g., an upper page), in one embodiment. Thus, a different back bias may be used when verifying an intermediate state than the back bias used when verifying a final state. For example, a different back bias may be used when verifying an intermediate page than the back bias used when verifying an upper page. Using the back bias makes it easier to verify a low $V_{TH}$, such as a negative $V_{TH}$. Also, using the back bias is effective at dealing with sense amplifier headroom issues.

Figure 1:
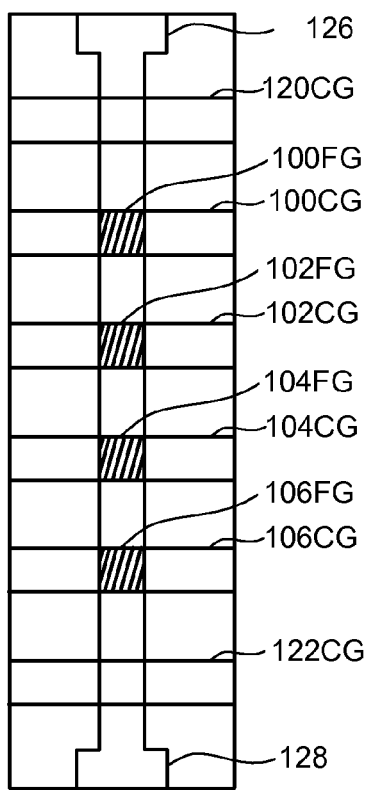
FIG. 1 is a top view of a NAND string.
Figure 2:
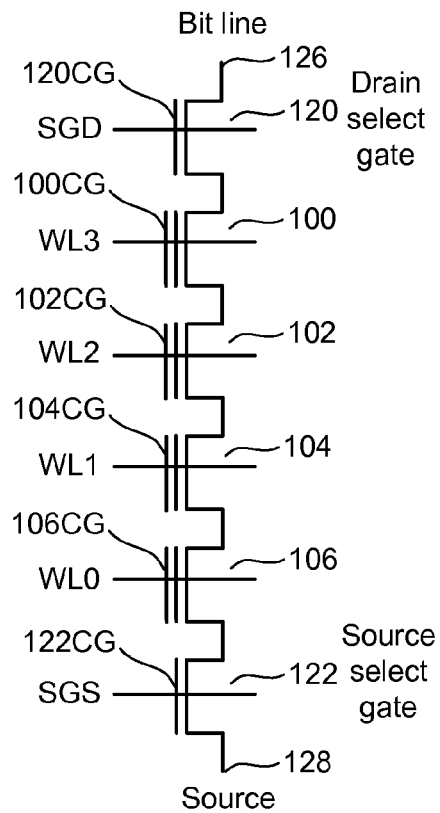
FIG. 2 is an equivalent circuit diagram of the NAND string of FIG. 1.

One example of a memory system suitable for implementing embodiments uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
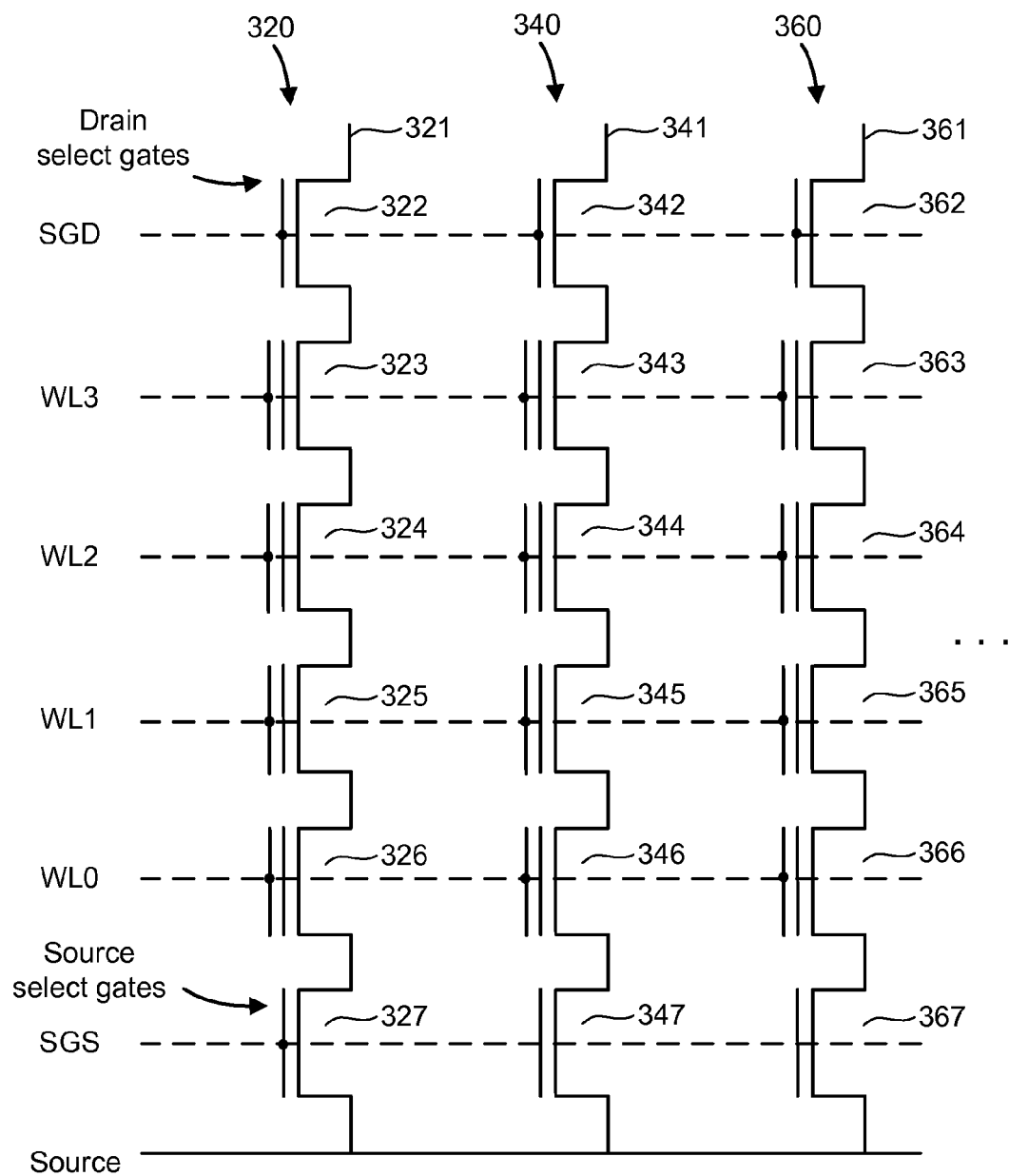
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522, 580, 5,570,315, 5,774,397, 6,046,935, 6,456,528 and 6,522, 580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line.

As discussed above, one storage element in each of the NAND strings share the same word line. For example, when programming storage element 324 of FIG. 3, the program voltage will also be applied to the control gates of storage elements 344 and 364.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

Figure 4:
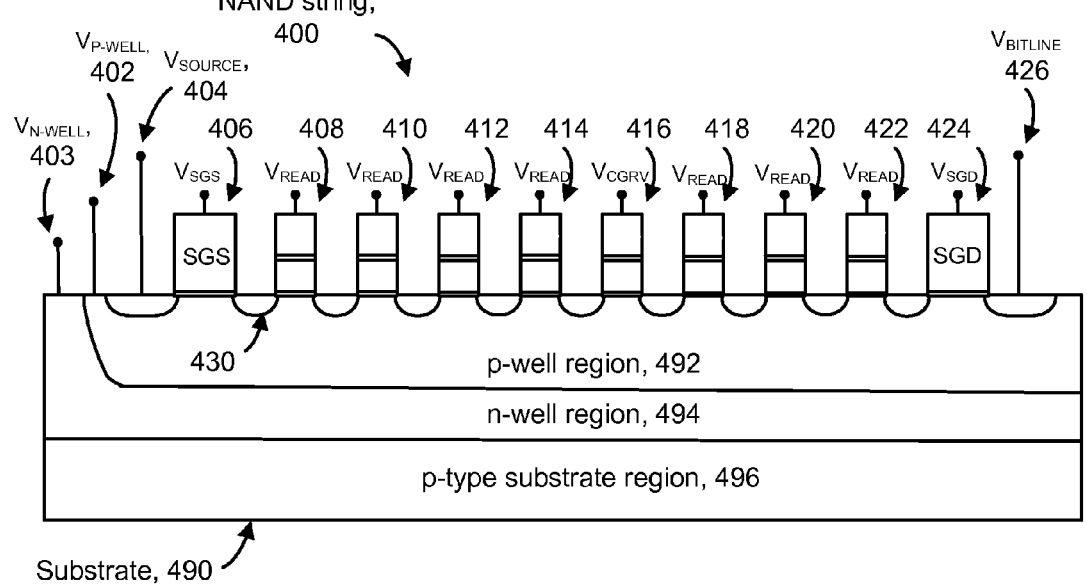
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region 492. A source supply line 404 with a potential of $V_{SOURCE}$ is provided in addition to a bit line 426 with a potential of $V_{BIT\ LINE}$. A voltage $V_{P\text{-}WELL}$ is applied to the p-well region 492. A voltage $V_{N\text{-}WELL}$ is applied to the n-well region 494.

Body bias may be applied by suitable selection of the voltages to the p-well region 492 and the source supply line 404. Applying the same voltage to the p-well region 492 and the source supply line 404 results in no body bias. In one possible approach, $V_{P\text{-}WELL}$ is lower than $V_{SOURCE}$ to achieve a body bias. In another possible approach, $V_{P\text{-}WELL}$ is greater in magnitude than $V_{SOURCE}$ to achieve a body bias. $V_{P\text{-}WELL}$ could be 0V, positive, or negative, when applying body bias. Likewise, $V_{SOURCE}$ could be 0V, positive, or negative, when applying body bias, noting that $V_{SOURCE}$ should be different from $V_{P\text{-}WELL}$.

In one approach, $V_{N\text{-}WELL}$ is the same as $V_{P\text{-}WELL}$ when applying body bias (as well as with no body bias). This avoids forward biasing the pn junction between the p-well region 492 and n-well region 494. In one approach, suitable voltages are applied to regions 492, 494, and 496 such that none of the p-n junctions are forward biased. The p-type substrate region 496 can be grounded, as one option. In this case, if a positive voltage is applied to the n-well region 494, the p-n junction formed between the p-type substrate region 496 and the n-well 494 is reverse biased.

In one embodiment, the back bias is applied when verifying an intermediate state during programming. However, the back bias is either not applied or a lower back bias is applied when verifying a final state during that programming operation. In one embodiment, the back bias is applied when verifying a lower or intermediate page during programming. However, the back bias is either not applied or a lower back bias is applied when verifying an upper page during that programming operation. In one embodiment, the back bias is applied when verifying during a foggy programming stage, but the back bias is not applied (or less back bias is applied) when verifying during a fine programming stage.

When verifying, $V_{CGRV}$ is provided on a selected word line, in this example, WL4, which is associated with storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A read pass voltage, $V_{READ}$ is applied to the remaining word lines associated with NAND string 400, in one possible boosting scheme. The read pass voltage is one the causes the memory cells to conduct regardless of their $V_{TH}$. $V_{SGS}$ and $V_{SGD}$ are applied to the select gates 406 and 424, respectively.

Figure 5:
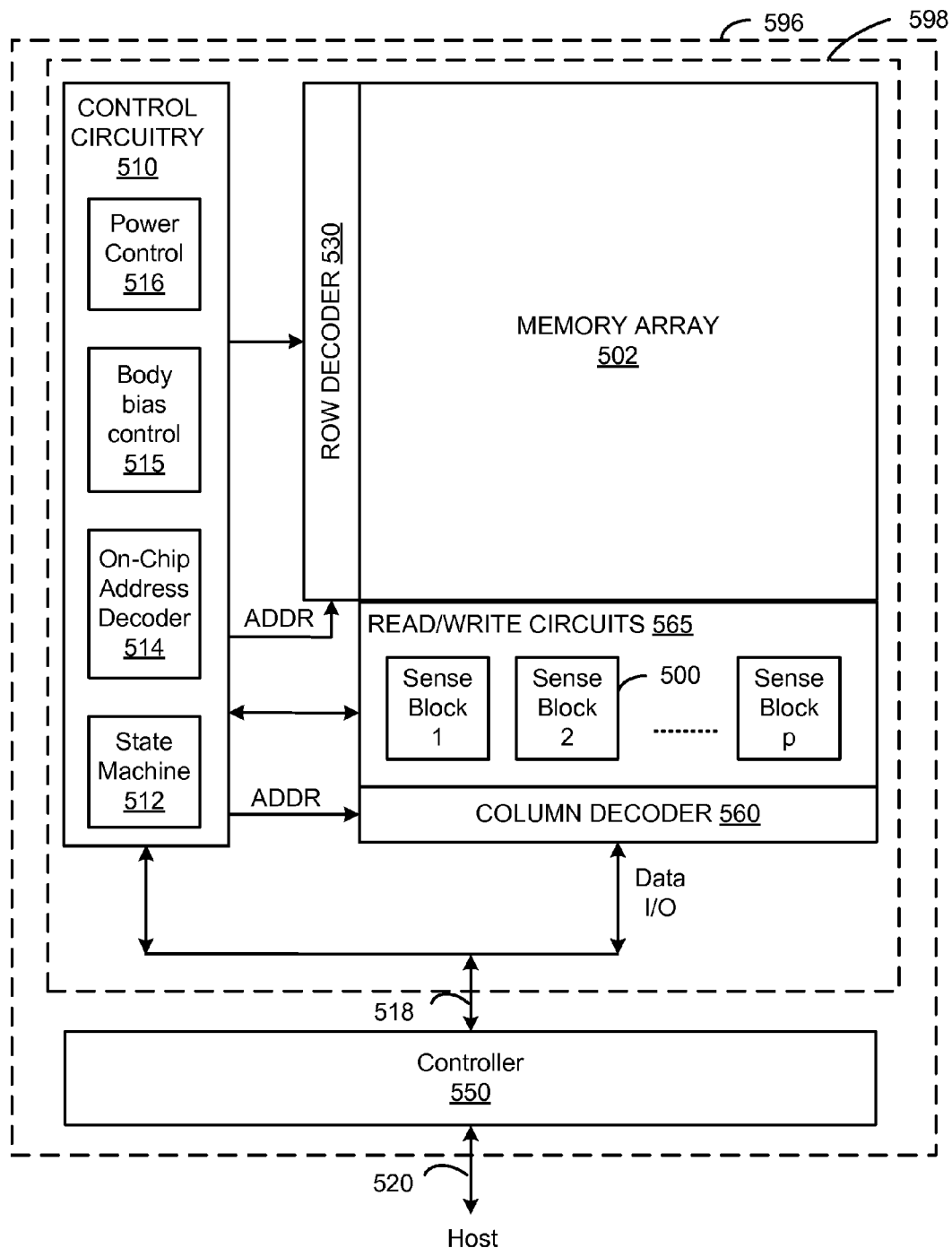
FIG. 5 is a block diagram of a non-volatile memory system using single row/column decoders and read/write circuits.

FIG. 5 is a block diagram of a non-volatile memory system using single row/column decoders and read/write circuits. The diagram depicts a memory device 596 having read/write circuits for reading and programming a page of storage elements in parallel, according to one embodiment of the present invention. Memory device 596 may include one or more memory die. One example of a memory die or chip 598 includes a two-dimensional array of storage elements 502, control circuitry 510, and read/write circuits 565. In some embodiments, the array of storage elements can be three dimensional. The memory array 502 is addressable by word lines via a row decoder 530 and by bit lines via a column decoder 560. The read/write circuits 565 include multiple sense blocks 500 and allow a page of storage elements to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 502. The control circuitry 510 includes a state machine 512, an on-chip address decoder 514, a body bias control circuit 515, and a power control module 516. The body bias control circuit 515 determines one or more body bias levels which are to be applied to the memory array 502. The body bias level determination may be made based on various factors, as discussed previously. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In some implementations, some of the components of FIG. 5 can be combined. In various designs, one or more of the components (alone or in combination), other than storage element array 502, can be thought of as a managing circuit. For example, one or more managing circuits may include any one of or a combination of control circuitry 510, state machine 512, decoders 514/560, power control 516, sense blocks 500, read/write circuits 565, controller 550, etc.

Figure 6:
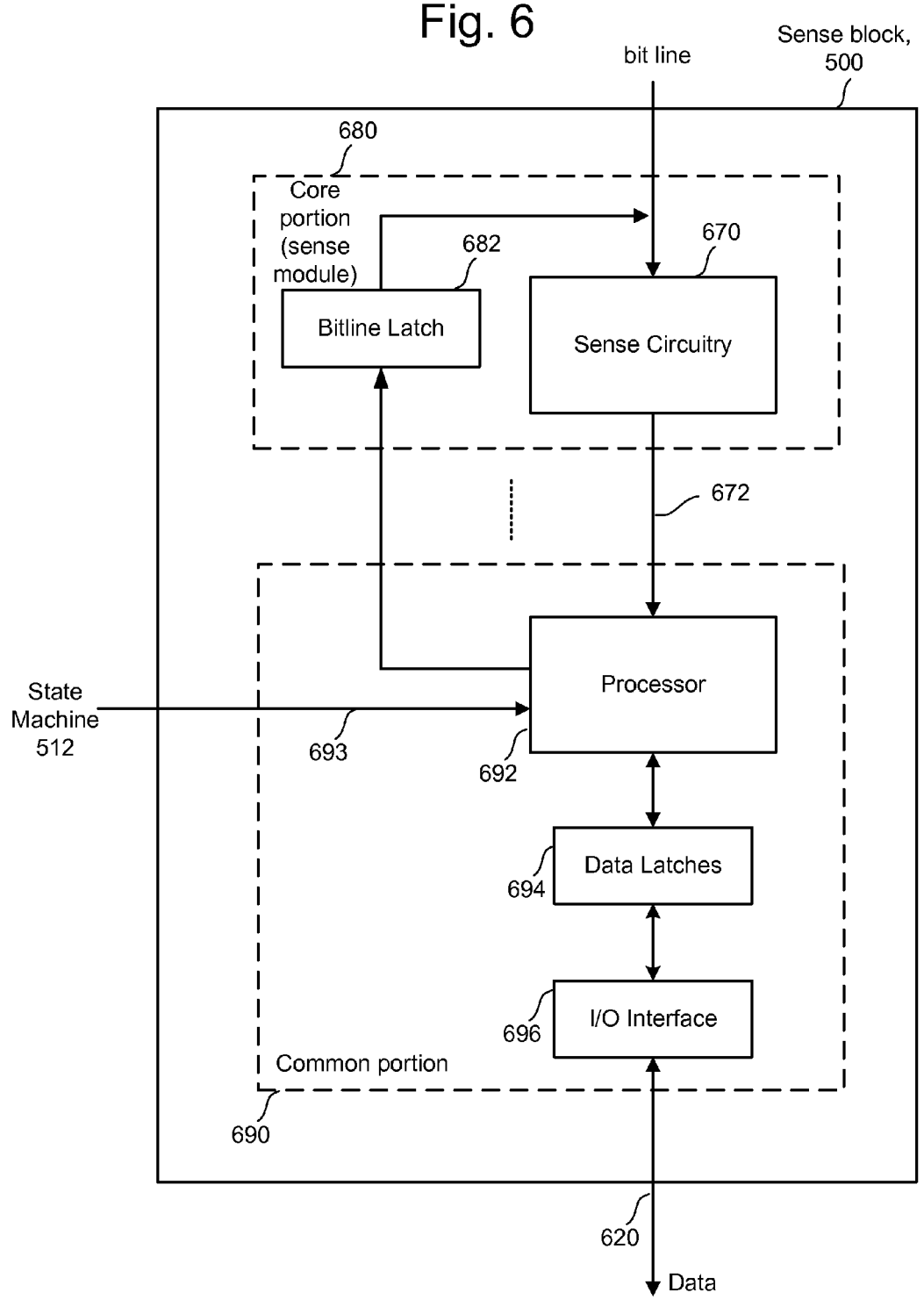
FIG. 6 is a block diagram depicting one embodiment of a sense block.

FIG. 6 is a block diagram depicting one embodiment of the sense block 500 of FIG. 5. A sense block is used to determine the programming condition of a non-volatile storage element. An individual sense block 500 is partitioned into a core portion, referred to as a sense module 680, and a common portion 690. In one embodiment, there will be a separate sense module 680 for each bit line and one common portion 690 for a set of multiple sense modules 680. In one example, a sense block will include one common portion 690 and eight sense modules 680. Each of the sense modules in a group will communicate with the associated common portion via a data bus 672. For further details refer to U.S. Patent Application Pub No. 2006/0140007, titled "Non-Volatile Memory & Method with Shared Processing for an Aggregate of Sense Amplifiers" published Jun. 29, 2006, and incorporated herein by reference in its entirety.

Sense module 680 comprises sense circuitry 670 that determines whether a conduction current in a connected bit line is above or below a predetermined threshold level. Sense module 680 also includes a bit line latch 682 that is used to set a voltage condition on the connected bit line. For example, a predetermined state latched in bit line latch 682 will result in the connected bit line being pulled to a state designating program inhibit (e.g., Vdd).

Common portion 690 comprises a processor 692, a set of data latches 694 and an I/O Interface 696 coupled between the set of data latches 694 and data bus 620. Processor 692 performs computations. For example, one of its functions is to determine the data stored in the sensed storage element and store the determined data in the set of data latches. The set of data latches 694 is used to store data bits determined by processor 692 during a read operation. It is also used to store data bits imported from the data bus 620 during a program operation. The imported data bits represent write data meant to be programmed into the memory. I/O interface 696 provides an interface between data latches 694 and the data bus 620.

During read or sensing, the operation of the system is under the control of state machine 512 that controls the supply of different control gate voltages to the addressed storage element. As it steps through the various predefined control gate voltages corresponding to the various memory states supported by the memory, the sense module 680 may trip at one of these voltages and an output will be provided from sense module 680 to processor 692 via bus 672. At that point, processor 692 determines the resultant memory state by consideration of the tripping event(s) of the sense module and the information about the applied control gate voltage from the state machine via input lines 693. It then computes a binary encoding for the memory state and stores the resultant data bits into data latches 694. In another embodiment of the core portion, bit line latch 682 serves double duty, both as a latch for latching the output of the sense module 680 and also as a bit line latch as described above.

It is anticipated that some implementations will include multiple processors 692. In one embodiment, each processor 692 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 694 from the data bus 620. The program operation, under the control of the state machine, comprises a series of programming voltage pulses applied to the control gates of the addressed storage elements. Each programming pulse is followed by a read back (verify) to determine if the storage element has been programmed to the desired memory state. Processor 692 monitors the read back memory state relative to the desired memory state. When the two are in agreement, the processor 692 sets the bit line latch 682 so as to cause the bit line to be pulled to a state designating program inhibit. This inhibits the storage element coupled to the bit line from further programming even if programming pulses appear on its control gate. In other embodiments the processor initially loads the bit line latch 682 and the sense circuitry sets it to an inhibit value during the verify process.

Data latch stack 694 contains a stack of data latches corresponding to the sense module. In one embodiment, there are three data latches per sense module 680. In some implementations (but not required), the data latches are implemented as a shift register so that the parallel data stored therein is converted to serial data for data bus 620, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory and Method with Reduced Source Line Bias Errors,"; (2) U.S. Pat. No. 7,023,736, "Non-Volatile Memory and Method with Improved Sensing,"; (3) U.S. Pat. No. 7,046,568, "Memory Sensing Circuit and Method for Low Voltage Operation"; (4) U.S. Pat. No. 7,196,928, "Compensating for Coupling during Read Operations of Non-Volatile Memory," and (5) U.S. Pat. No. 7,327,619, "Reference Sense Amplifier for Non-Volatile Memory". All five of the immediately above-listed patent documents are incorporated herein by reference in their entirety.

Figure 7:
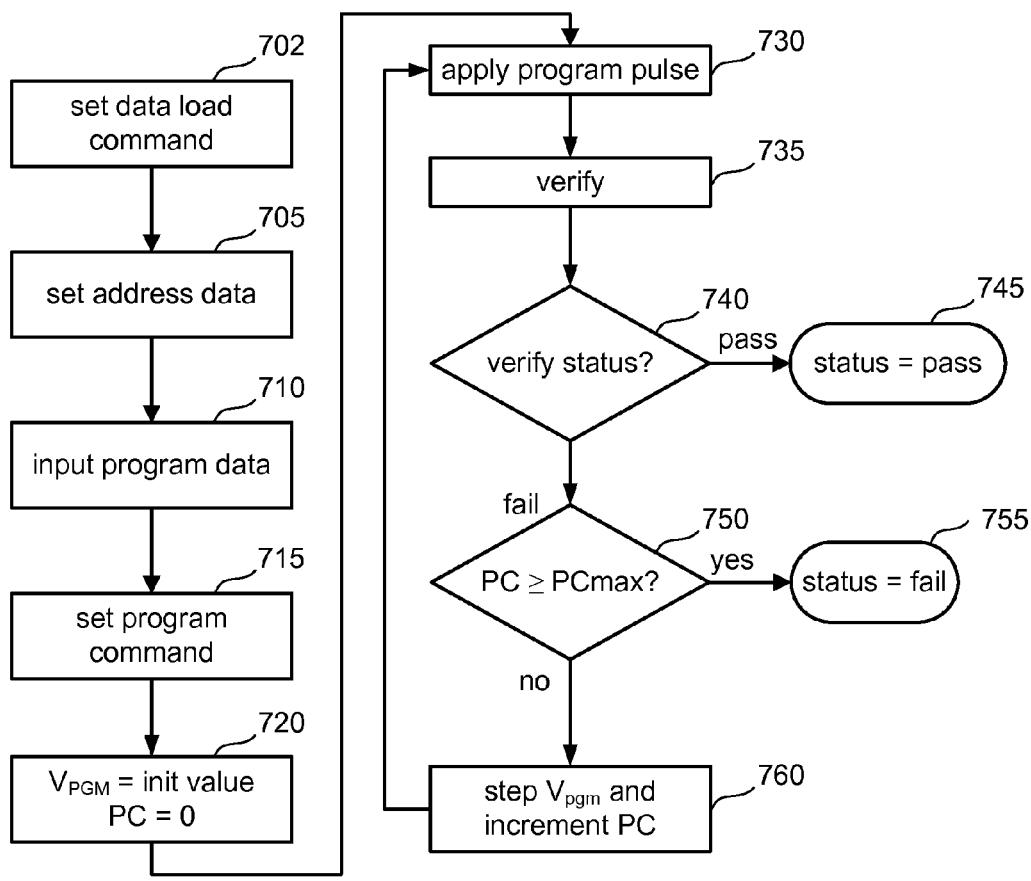
FIG. 7 is a flow chart describing one embodiment of a method for programming non-volatile memory.

FIG. 7 is a flow chart describing one embodiment of a method for programming non-volatile memory. This programming process involves a verify operation. The amount of back bias that is applied during verify may depend on what portion of the programming operation is being verified. Further details are discussed below.

Note that programming the memory cells can be divided into stages. The process of FIG. 7 may be performed once for each stage. For example, one stage could program a lower page, and another stage can be used to program an upper page. In one embodiment, the same back bias during verify is used throughout the process (e.g., throughout the same stage). However, a different amount of back bias can be used for a different stage, as one example.

The process may be used to program memory cells having floating gates, those having charge trapping layers (e.g., ONO), or other types of memory cells.

In one implementation, storage elements are erased (in blocks or other units) prior to programming. In step 702, a "data load" command is issued by the controller and input received by control circuitry 510. In step 705, address data designating the page address is input to decoder 514 from the controller or host. In step 710, a page of program data for the addressed page is input to a data buffer for programming. That data is latched in the appropriate set of latches. In step 715, a "program" command is issued by the controller to state machine 512.

Figure 8:
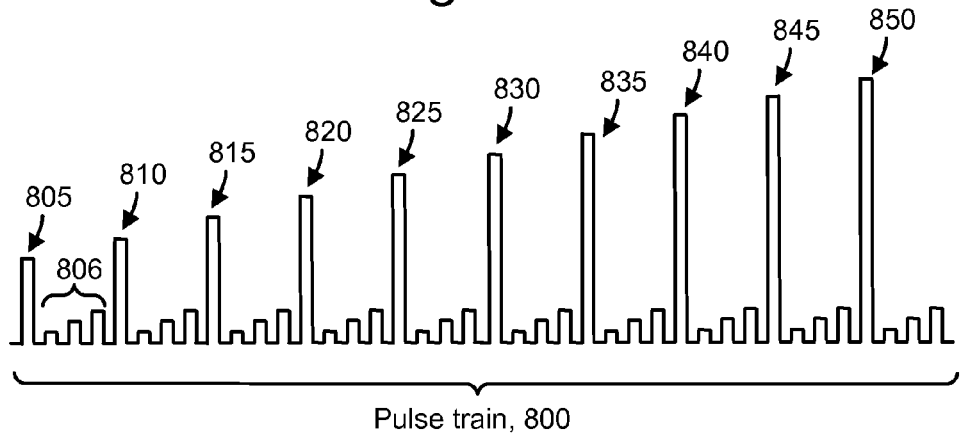
FIG. 8 depicts an example pulse train applied to the control gates of non-volatile storage elements during programming.

Triggered by the "program" command, the data latched in step 710 will be programmed into the selected storage elements controlled by state machine 512 using the stepped program pulses 805, 810, 815, 820, 825, 830, 835, 840, 845, 850, . . . of the pulse train 800 of FIG. 8 applied to the appropriate selected word line. In step 720, the program voltage, $V_{PGM}$, is initialized to the starting pulse (e.g., 12 V or other value) and a program counter (PC) maintained by state machine 512 is initialized at zero. In step 730, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd to inhibit programming.

In step 735, the states of the selected storage elements are verified. This step may or may not include applying back bias. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 740, a check is made as to whether all of the data latches are storing logic "1." If all of the data latches are storing logic "1," the programming process is complete and successful because all selected storage elements were programmed and verified. A status of "PASS" is reported in step 745.

If, in step 740, it is determined that not all of the data latches are storing logic "1," then the programming process continues. In step 750, the program counter PC is checked against a program limit value PCmax. One example of a program limit value is twenty; however, other numbers can also be used. If the program counter PC is not less than PCmax, then the program process has failed and a status of "FAIL" is reported in step 755. If the program counter PC is less than PCmax, then $V_{PGM}$ is increased by the step size and the program counter PC is incremented in step 760. The process loops back to step 730 to apply the next $V_{PGM}$ pulse.

FIG. 8 depicts an example pulse train 800 applied to the control gates of non-volatile storage elements during programming. The pulse train 800 includes a series of program pulses 805, 810, 815, 820, 825, 830, 835, 840, 845, 850, . . . , that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 806 includes three verify pulses. In some embodiments, there can be a verify pulse for each state that data is being programmed into, e.g., state A, B and C. In other embodiments, there can be more or fewer verify pulses.

Note that the verify pulses 806 that are depicted are just one example. A different set of verify pulses may be used depending on what state(s) are being verified for this portion of the programming operation. For example, different verify pulses 806 could be used for verifying an upper page than for verifying a lower page. Also, the amount of back bias that is used when applying the verify pulses 806 may depend on what state(s) are being verified. For example, when verifying an intermediate page, back bias might be used during the verify pulses 806. However, when verifying an upper page, no or less back bias might be used during the verify pulses 806.

FIG. 9 depicts an example set of threshold voltage distributions following a program operation. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, embodiments can also be used with other multi-state structures including those that include more or fewer than four states.

The data may be programmed into the memory cells as a lower page and an upper page. For state E, both pages store a "1." For state A, the lower page stores a "1" and the upper page stores a "0." For state B, both pages store "0." For state C, the lower page stores "0" and the upper page stores "1." Note that although specific bit patterns have been assigned to each of the states, different bit patterns may also be assigned.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

A variety of programming sequences can be used with embodiments. The following are a few programming sequences. However, embodiments that apply back bias when verifying are not limited to these example programming sequences.

FIGS. 10A-10B disclose a programming sequence that first programs a lower page, followed by an upper page. This process may reduce the effect of floating gate to floating gate coupling. The programming process is a two-stage process. In the first stage, the lower page is programmed. If the lower page is to remain data 1, then the storage element state remains at state E. If the data is to be programmed to 0, then the threshold of voltage of the storage element is raised such that the storage element is programmed to state LM. FIG. 10A therefore shows the programming of storage elements from state E to state LM 1050. State LM 1050 is an interim (or intermediate) state; therefore, the verify point is depicted as Vvlm, which is lower than Vvb.

In one embodiment, after a storage element is programmed from state E to state LM, its neighbor storage element (WLn−1) in the NAND string will then be programmed with respect to its upper page. Next, its neighbor storage element (WLn+1) in the NAND string will then be programmed with respect to its lower page. An effect that this programming sequence may have $V_{TH}$ distributions will be discussed below. Thus, note that the LM state distribution 1050 may shift to higher $V_{TH}$, as shown in FIG. 10B.

FIG. 10B depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1060, which may be widened and/or shifted relative to distribution 1050, and the upper page data is to be a 0, then the storage element will be programmed to final state B. If the storage element is in intermediate threshold voltage distribution 1060 and the upper page data is to become data 1, then the threshold voltage of the storage element will be raised so that the storage element is in state C. The process depicted by FIGS. 10A-B reduces the effect of floating gate to floating gate coupling because only the upper page programming of neighbor storage elements will have an effect on the apparent threshold voltage of a given storage element.

Although FIGS. 10A-B provide an example with respect to four data states and two pages of data, the concepts taught can be applied to other implementations with more than four states and more than two pages.

Note that the programming process of FIG. 7 may be performed once for the first pass shown in FIG. 10A, and again for the second pass shown in FIG. 10B. In some embodiments, different amounts of back bias are used depending on which programming pass is used. For example, back bias could be used for verifying the LM state 1050 in the first programming pass. Less or no back bias might be used when verifying during the second programming pass in FIG. 10B. Other possibilities exist.

FIGS. 11A-11C depict one embodiment of a three pass programming sequence. The first pass depicted in FIG. 11A programs the lower page. In the first pass, storage elements intended for either the B- or C-states are programmed from the Erased state 1100 to an intermediate state 1105.

FIG. 11B depicts the second programming pass in which the B- and C-states are programmed. Storage elements targeted for the B-state are programmed from the LM-state 1105 to the B-state 1104. Storage elements targeted for the C-state are programmed from the LM-state 1105 to the C-state 1106. However, note that the A-state is not programmed during the second programming pass. Note that both the Er-state 1100 and the LM-state 1105 may have widened distributions relative to FIG. 11A, due to programming of neighboring word lines.

FIG. 11C depicts a third programming pass in which the A-state is programmed. Storage elements targeted for the A-state are programmed from the Er-state 1100 to the A-state 1102. Thus, note that the A-state programming is not started until the B- and C-states are complete.

The programming process of FIG. 7 may be performed once for each pass shown in FIGS. 11A-11C. In some embodiments, different amounts of back bias are used depending on which programming pass is used. For example, back bias could be used for verifying the LM state 1105 in the first programming pass. Less or no back bias might be used when verifying during the second and third programming passes in FIGS. 11B-11C. Other possibilities exist.

Figure 12A:
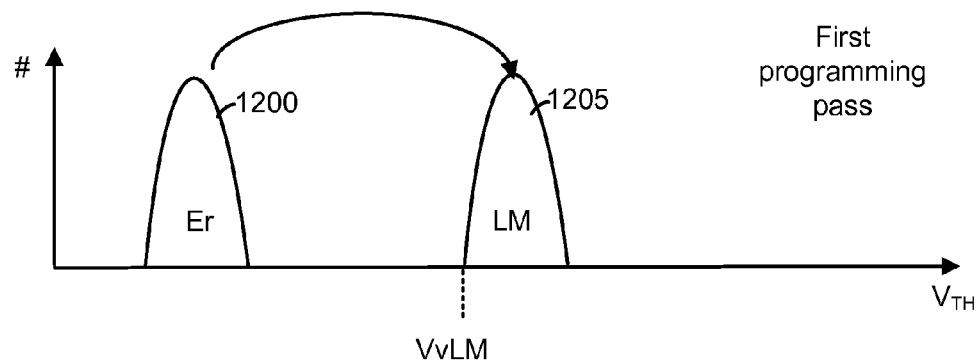
FIGS. 12A, 12B and 12C depict one embodiment of a three pass programming sequence in which the C-state is programmed prior to starting the other states.
Figure 12B:
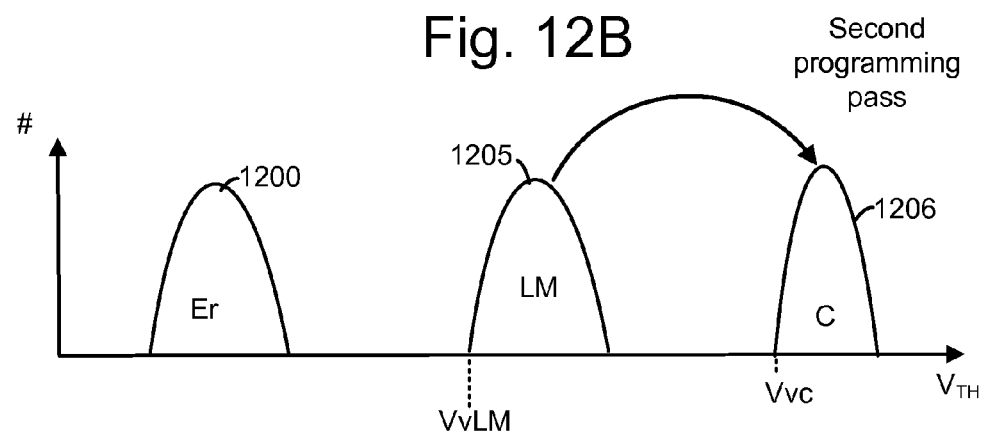
Figure 12C:
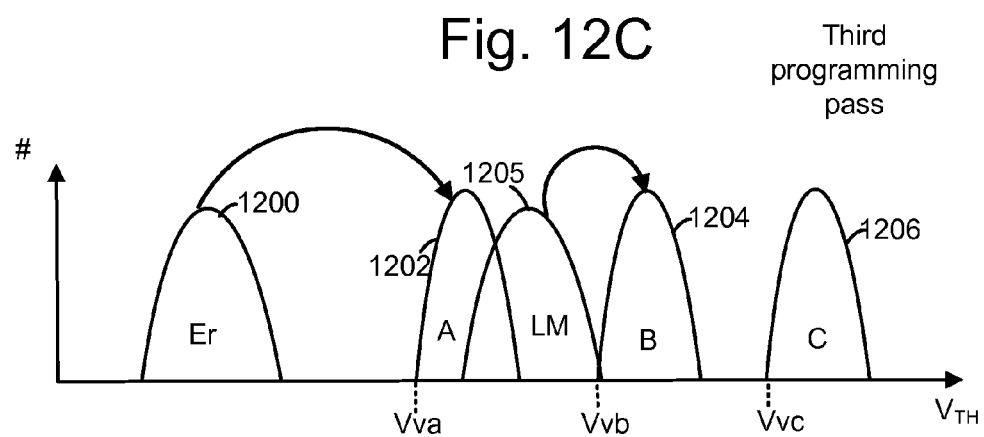

FIGS. 12A, 12B and 12C depict one embodiment of a three pass programming sequence in which the C-state is programmed prior to starting the other states. The first pass depicted in FIG. 12A programs the lower page. Thus, in the first pass storage elements intended for either the B- or C-states are programmed from the erased state 1200 to an intermediate state 1205. FIG. 12B depicts the C-state being programmed in the second programming pass. Storage elements targeted for the C-state are programmed from the intermediate state 1205 to the C-state 1206. Note that both the Er-state 1200 and the LM-state 1205 may have widened $V_{TH}$ distributions relative to FIG. 12A, due to programming of neighboring word lines.

FIG. 12C depicts the A- and B-states being programmed. Storage elements targeted for the A-state are programmed from the Er-state 1200 to the A-state 1202. Storage elements targeted for the B-state are programmed from the intermediate state 1205 to the B-state 1204.

The programming process of FIG. 7 may be performed once for each pass shown in FIGS. 12A-12C. In some embodiments, different amounts of back bias are used depending on which programming pass is used. For example, back bias could be used for verifying the LM state 1205 in the first programming pass. Less or no back bias might be used when verifying during the second and third programming passes. Other possibilities exist.

When using one or more of the programming sequences in which lower and upper pages are programmed, the programming process may program pages on neighbor word lines between the programming of the lower and upper pages on a selected word line. Many possible orders can be used. The following table describes one possible sequence of programming lower pages and upper pages. Other sequences are possible. In general, word lines may be programmed from lower numbered word lines to higher numbers, in this example. This may correspond to programming from the source line towards the bit line (drain side of NAND string).

TABLE I

| WL | Lower Page | Upper Page |
| --- | --- | --- |
| WLn + 1 | 5 | 8 |
| WLn | 3 | 6 |
| WLn − 1 | 1 | 4 |

As the above sequence shows, when the lower page of WLn is programmed, the lower page of WLn−1 has already been programmed. After programming the lower page of WLn, the upper page on WLn−1 is programmed. Then, the lower page on WLn+1 is programmed. Next, the upper page in WLn is programmed. Thus, when programming the upper page on WLn, one neighbor has had its upper page programmed and the other neighbor has not. As will be discussed below, the programming of the upper page into WLn−1 may impact the apparent Vt of the memory cells on WLn that are presently in the lower page distribution. Likewise, the programming of the lower page on WLn+1 may impact the apparent Vt of the memory cells on WLn that are presently in the lower page distribution.

In this example, it is the source side neighbor of WLn that has its upper page programmed (and drain side not programmed). However, it is possible to have a programming sequence in which it is the drain side neighbor that has its upper page programmed (and source side not programmed).

Figure 13A:
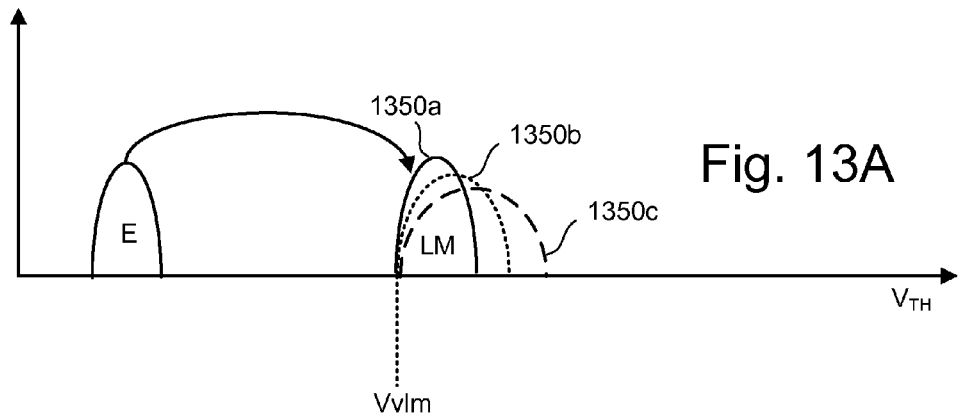
FIG. 13A-13C depict one embodiment of programming a lower, middle, and upper page.
Figure 13B:
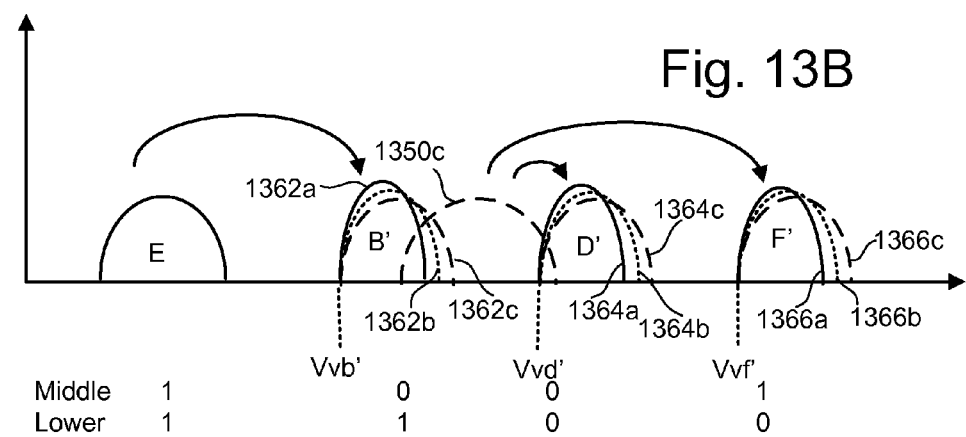
Figure 13C:
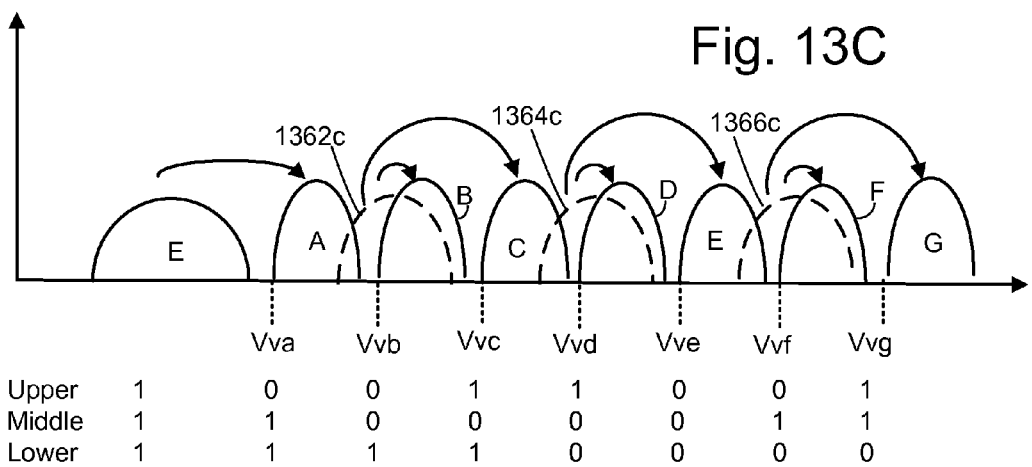

The previous programming examples programmed a lower page followed by an upper page. Similar principles may also apply to programming three bits per memory cell. FIG. 13A-13C depict programming a lower, middle, and upper page. FIGS. 13A-13B are similar to FIGS. 11A-11B. In the first step shown in FIG. 13A, the lower page is programmed. If the lower page is to remain data 1, then the storage element state remains at state E. If the lower page data is to be programmed to 0, then the threshold of voltage of the storage element is raised such that the storage element is programmed to state LM. FIG. 13A therefore shows the programming of storage elements from state E to state LM 1350. State LM 1350 is an interim (or intermediate) state; therefore, the verify point is depicted as Vvlm, which is lower than Vvd'.

LM distribution 1350a is the distribution right after programming. LM distribution 1350b shows spreading due to programming on a neighbor word line. LM distribution 1350c shows additional spreading due to programming on another neighbor word line. The E-state may also spread, but this is not shown in FIG. 13A.

FIG. 13B depicts the process of programming the middle page. If the storage element is in erased state E and the middle page is to be at 1, then the storage element will remain in state E. If the storage element is in state E and its middle page data is to be programmed to 0, then the threshold voltage of the storage element will be raised so that the storage element is in state B' 1362.

If the storage element was in intermediate threshold voltage distribution 1350c, which may widened and/or shifted relative to initial LM distribution 1350a, and the middle page data is to be 0, then the storage element will be programmed to state D' 1364. If the storage element is in intermediate threshold voltage distribution 1360 and the middle page data is to become data 1, then the threshold voltage of the storage element will be raised so that the storage element is in state F' 1366. States 1362, 1364, and 1366 may all be considered to be intermediate states.

Note that intermediate states 1362, 1364 and 1366 may also shift and/or spread due to programming on a neighboring word line. Right after programming, there are initial distributions 1362a, 1364a, and 1366a. After programming on one neighboring word line, there may be a shift and/or spreading to distributions 1362b, 1364b, and 1366b. After programming on another neighboring word line, there may be a further shift and/or additional spreading to distributions 1362c, 1364c, and 1366c. Note that these shifts/spreads are examples, and that other shifting and/or spreading could occur with a different programming sequence.

FIG. 13C depicts the process of programming the upper page. In this stage, memory cells in state E that are to have a 1 in the upper page remain at state E. Memory cells in state E that are to have a 0 in the upper page are programmed to state A. Memory cells in state B' 1362c that are to have a 0 in the upper page are programmed to state B. Memory cells in state B' 1362c that are to have a 1 in the upper page are programmed to state C. Memory cells in state D' 1364c that are to have a 1 in the upper page are programmed to state D. Memory cells in state D' 1364c that are to have a 0 in the upper page are programmed to state E. Memory cells in state F' 1366c that are to have a 0 in the upper page are programmed to state F. Memory cells in state F' 1366c that are to have a 1 in the upper page are programmed to state G. Other coding schemes could be used.

In some embodiments, different amounts of back bias are used depending on which programming pass is used. For example, back bias could be used for verifying the LM state 1350 in the first programming pass of FIG. 13A. In one option, back bias is used for verifying in the second programming pass of FIG. 13B. In one option, less or no back bias (relative to the first pass) is used for verifying the in the second programming pass of FIG. 13B. Less or no back bias (relative to the first or second pass) might be used when verifying during the third programming pass in FIG. 13C. Other possibilities exist.

Figure 14A:
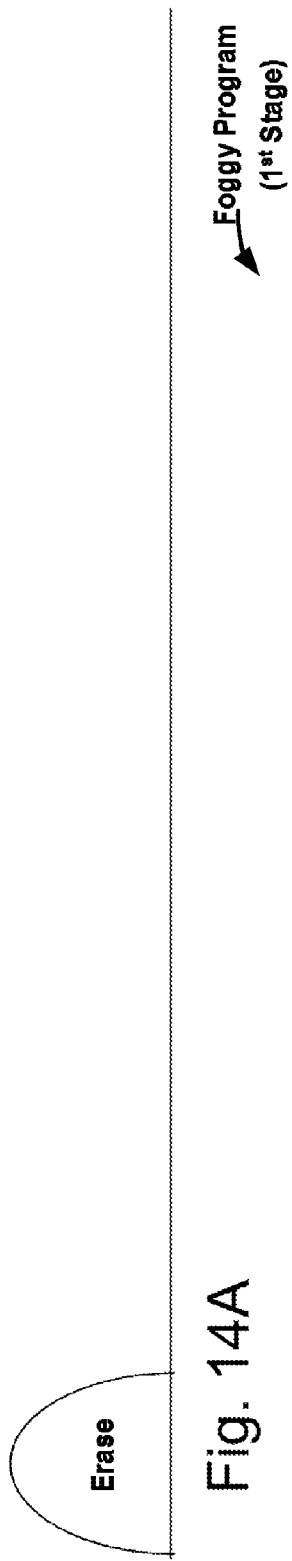
FIG. 14A-14C depict one embodiment of foggy/fine programming.
Figure 14B:
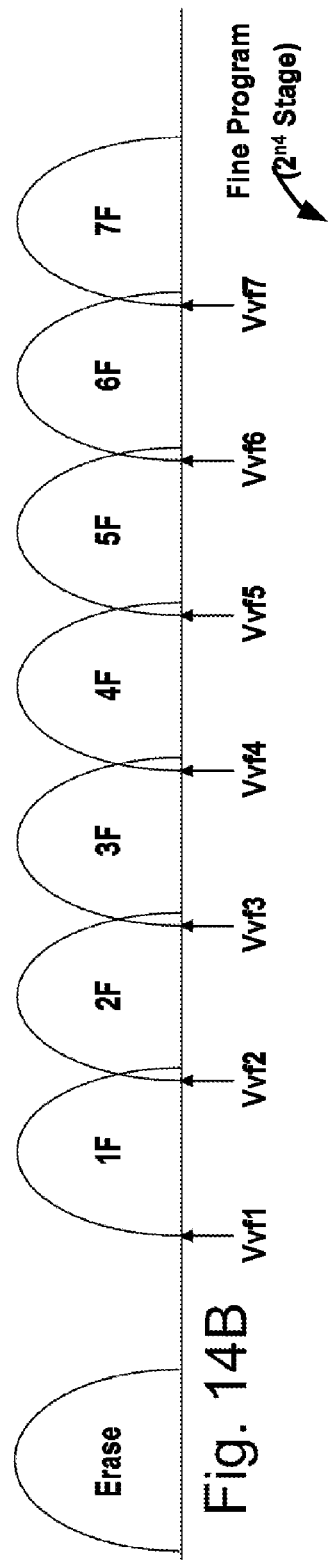

In one embodiment, the memory cells are programmed in a foggy/fine programming sequence. In one embodiment, the foggy/fine programming includes a first "foggy" programming stage and a second "fine" programming stage. FIG. 14A shows the distribution just after erase. FIG. 14B depicts one embodiment of $V_{TH}$ distributions after a foggy program stage. In this example, there is an erase state and seven foggy programmed states 1F-7F. At or near the lower edge of each foggy programmed state 1F-7F are verify reference voltages. For example, FIG. 14B shows verify voltage "Vvf1" for state "1F," verify voltage "Vvf2" for state "2F," etc. The intent of the foggy programming stage is to move the threshold voltages partway from the erased threshold distribution to the final target range. Note that some of these verify voltages could be negative.

Figure 14C:
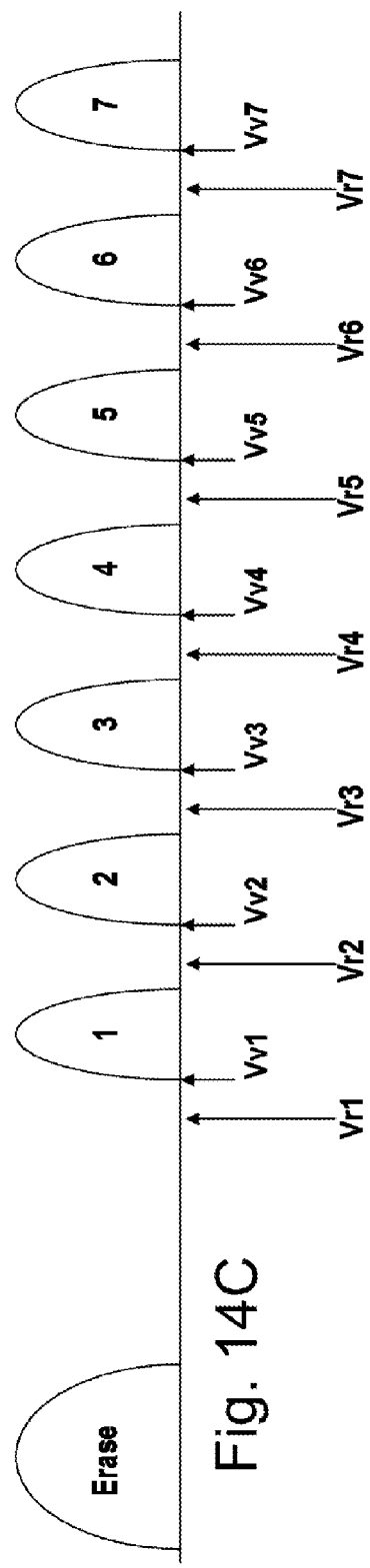

FIG. 14C depicts one embodiment of $V_{TH}$ distributions after a fine program stage. In this example, there is an erase state and seven fine programmed states 1F-7F. After the fine programming stage, the threshold voltages of the memory cells are within the final target range for each state. In this example, there is an erase state and seven final programmed states 1-7. At or near the lower edge of each final programmed state 1-7 are verify reference voltages. For example, FIG. 14C shows verify voltage "Vv1" for state "1," verify voltage "Vv2" for state "2," etc. FIG. 14C also depicts read reference voltages between the programmed states. For example, read reference voltage Vr1 is between the erased state and state 1, read reference voltage Vr2 is between state 1 and state 2, etc. By testing whether the threshold voltage of a given memory cell is above or below the respective read reference voltages, the system can determine what state the memory cell is in. Referring back to FIG. 14B note that read reference voltages are not needed for the foggy programmed states because these are intermediate programmed states.

In another embodiment of foggy/fine programming, the first step is to program the memory cells to an intermediate state. FIG. 15A depicts example threshold voltage distributions after the intermediate state program stage. Initially, the memory cell that will eventually be in one of the four highest states are programmed to the intermediate state. Next, a foggy programming is performed. In this stage, foggy programming from the erase state to 1F, 2F, and 3F is performed. Also, foggy programming from the intermediate state to 4F, 5F, 6F, and 7F is performed. These states may be similar to 1F-7F in FIG. 14B, and may have similar verify levels. Next, a fine programming can be performed to result in a distribution such as FIG. 14C.

In some embodiments, different amounts of back bias are used during a foggy/fine programming sequence, depending on which programming pass is used. For example, back bias could be used for verifying the foggy programming pass of FIG. 14B. Less or no back bias might be used when verifying during the fine programming pass in FIG. 14C. Other possibilities exist.

Referring to FIG. 15A, back bias could be used for verifying the intermediate state of FIG. 15A. However, back bias is optional for that intermediate state. The need to use back bias might depend on how low Vvi is. Back bias might be used when verifying during the foggy programming stage in FIG. 15B. However, when performing fine programming, less or no back bias might be used when verifying.

The following is a brief discussion explaining possible reasons why some programming techniques may result in difficulties in verifying various states. For some cases, intermediate states are more difficult to verify because of the low verify reference voltage level. Reasons why the low verify reference voltage levels are problematic will be discussed below. First, possible reasons why low verify reference voltage levels may be needed will be discussed.

As process technology scales, $V_{TH}$ shift by cell-to-cell interference increases. Even with LM programming, which reduces cell-to-cell interference significantly, the LM state of WLn may shift up after neighbor WLs are programmed. A requirement of the LM state is that the upper tail of the LM state should be low enough after LM programming of WLn+1 not to go beyond upper tail of B-state. This can result in the verify-level of LM state needing be lower and lower even to negative as the process technology scales.

Figure 16:
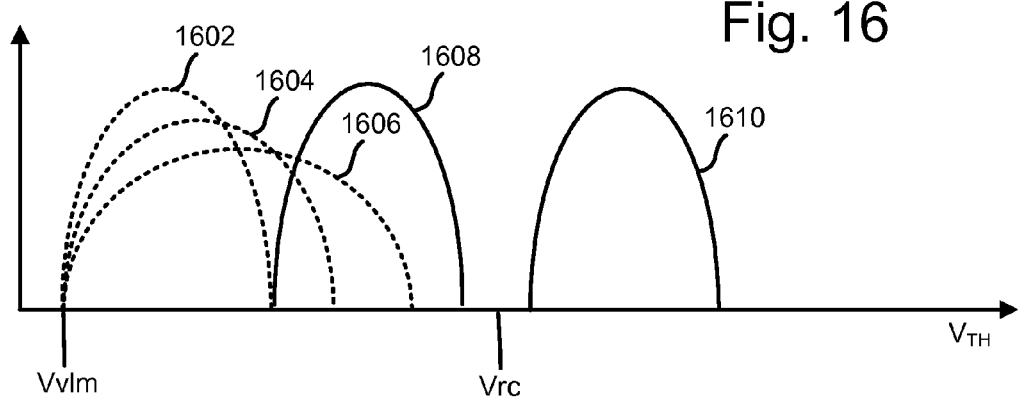
FIG. 16 depicts an example of $V_{TH}$ distributions as programming proceeds for a sequence in which first an LM state is programmed.

FIG. 16 depicts an example of $V_{TH}$ distributions as programming proceeds for a sequence in which first an LM state is programmed. This will be used to illustrate how a $V_{TH}$ distribution can shift during the programming process, as a result of programming other memory cells. Five $V_{TH}$ distributions are depicted. $V_{TH}$ distributions 1602-1606 are the LM distribution at different points in the programming process. A final B-state distribution 1608 and a final C-state distribution 1610 are also depicted.

$V_{TH}$ distribution 1602 represents the initial LM state distribution right after it is programmed on WLn. Afterwards, there may be additional programming on WLn-1 and/or WLn+1. As one example, next, an upper page is programmed on WLn-1. This causes the LM state distribution on WLn to shift or spread to distribution 1604. Later, a lower page is programmed on WLn+1. This causes the LM state distribution on WLn to shift or spread to distribution 1606. Then, the upper page is programmed on WLn. This results in the final B-state and C-state distributions 1608, 1610.

Note that if the upper tail of the LM distribution 1602-1606 creeps up too much, then some B-state memory cells could be over-programmed. That is, memory cells that were intended for the B-state may have a $V_{TH}$ that is past the upper tail of the B-state distribution 1608. Some may even have a $V_{TH}$ that is greater than Vrc. The foregoing is intended to illustrate a problem with one programming sequence. However, similar problems may occur with other programming sequences.

One possible solution to this problem is to establish the initial LM-state distribution 1602 at a lower $V_{TH}$. Depending on various factors, it may be necessary to have Vvlm be a negative voltage.

Figure 17:
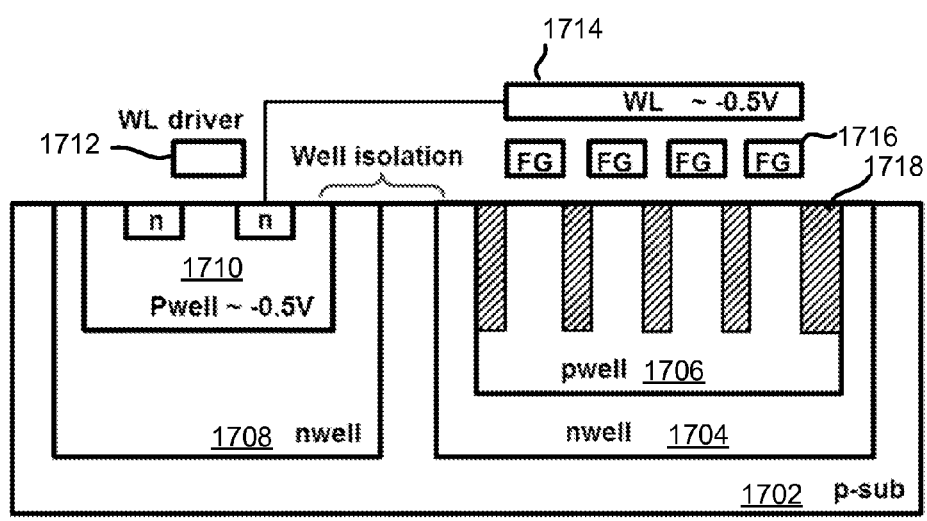
FIG. 17 depicts one possible technique for verifying a negative $V_{TH}$.

However, verifying that the memory cell has a negative $V_{TH}$ also present challenges. One possible technique for verifying a negative $V_{TH}$ is depicted in FIG. 17. In FIG. 17, nwell 1704 and pwell 1706 are in the memory array region. Several floating gates 1716 are depicted above the p-well region 1706. Shallow trench isolation (STI) 1718 are shown in pwell region 1706.

In this example, a negative voltage is applied to the word line 1714. In this scheme, WL drivers 1712 (usually nMOS) need to be in the isolated nwell 1708. The nwell 1708 provides isolation from other peripheral transistors and memory cells to avoid forward biasing a PN junction. The isolated n-well 1708 needed for well isolation may result in large area penalty. However, this does permit a negative voltage to be applied to the p-well 1710 in which the WL driver 1712 resides, such that the negative word line voltage is achieved. A common p-type substrate 1702 is also shown.

Figure 18:
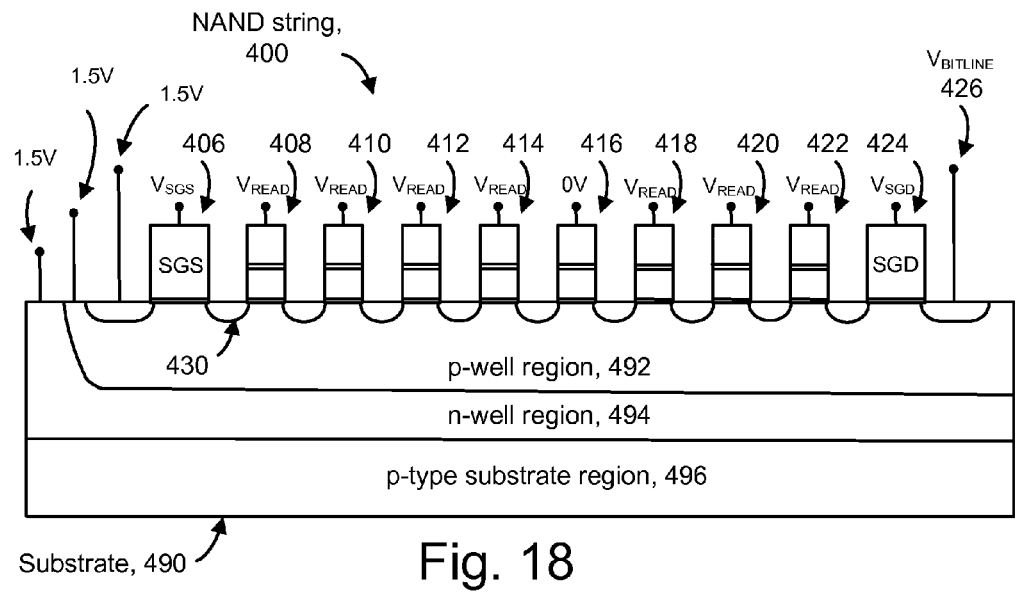
FIG. 18 depicts another possible technique for verifying a negative $V_{TH}$.

Another possible technique for verifying a negative $V_{TH}$ is to keep the word line voltage at zero and shift up the bias on the common source line and the substrate. FIG. 18 shows one possible technique in which 1.5V is applied to the common source line and p-well region 492, while the word line has 0V. The n-well 494 may also be biased on 1.5V to avoid forward biasing the pn junction between the p-well and n-well. The applied voltages have the effect of testing for a negative $V_{TH}$. This is because the selected word line (WL4 in this example) is 1.5 V below the source line.

However, there are limits for how much voltage can be applied to the common source line. The common source line voltage should be below the bit line voltage for operation in accordance with a sensing technique in which current flows from the drain to the source end of the NAND string. However, in some low voltage environments, there may be severe constraints on the bit line voltage. For example, the bit line voltage might be limited to about 1.7 V. In this case, the common source line might need to stay below, for example, 1.5 V. This problem may be referred to as a sense amplifier head room issue. For low voltage applications, such as mobile device applications, this can be a severe constraint.

Embodiments of the invention use back-bias to verify some states during a programming operation. For example, back bias can be used when verifying the LM state. However, no or reduced back-bias effect is used at upper page verify in embodiment of the invention, in one embodiment.

Figure 19A:
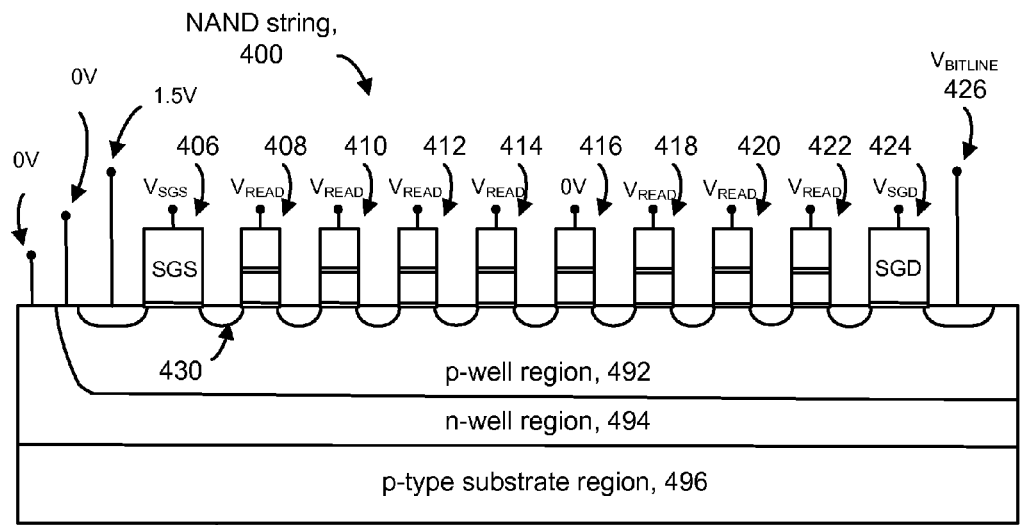
FIG. 19A shows example conditions to apply back bias, for one embodiment.

FIG. 19A shows example conditions to apply back bias, for one embodiment. In this example, the substrate is grounded and the common source line has 1.5V. Thus, the difference between the source and the substrate is 1.5V. In this example, 0V is applied to the control gate of the selected memory cell (by applying 0V to WL4). However, a higher or lower voltage could be applied to the control gate.

Since providing a negative voltage to the word line can present some challenges, in one embodiment, the control gate voltage is 0V or positive. Note that using back bias is not limited to the case in which 0V is applied to the control gate. For example, the control gate voltage can be positive. In one embodiment, a negative voltage is applied to the substrate. The back-bias effect may effectively raise the $V_{TH}$ of the memory cells being verified.

Figure 19B:
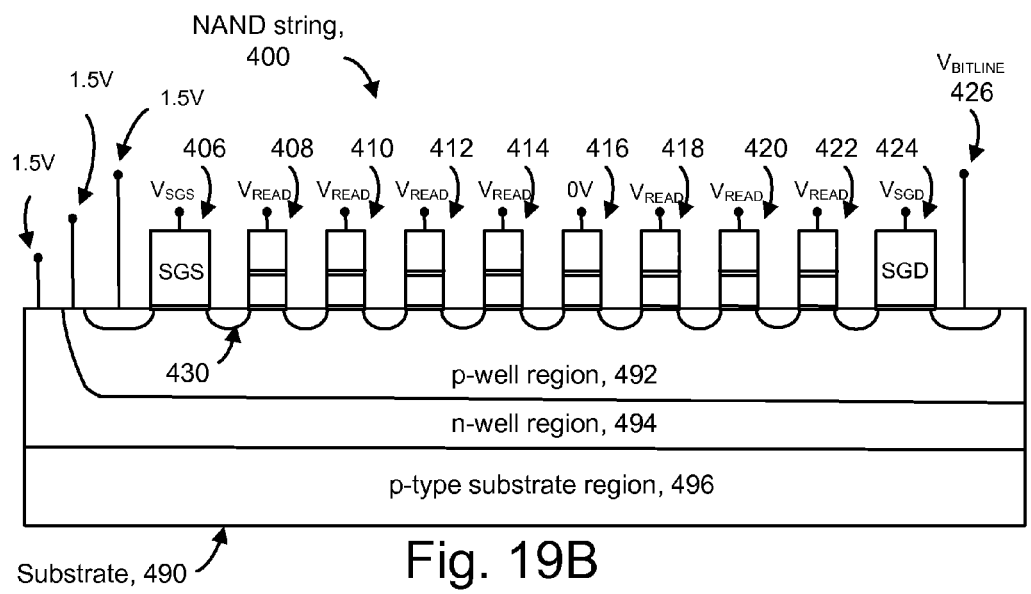
FIG. 19B shows example conditions for having no back bias, for one embodiment.

FIG. 19B shows example conditions for having no back bias, for one embodiment. In this example, 1.5V are applied to both the substrate and the common source line. Specifically, 1.5V are applied to both the p-well 492 and n-well 494 in this example. In this example, the voltage on the common source line is the same as when providing back bias in FIG. 19A. However, this is not a requirement. In general, for no back bias, the substrate and the common source line should be at the some voltage. However, a voltage of less than or greater than 1.5V can be used. Note, however, that the common source line voltage should be less than the bit line voltage for one embodiment of sensing techniques.

Figure 20:
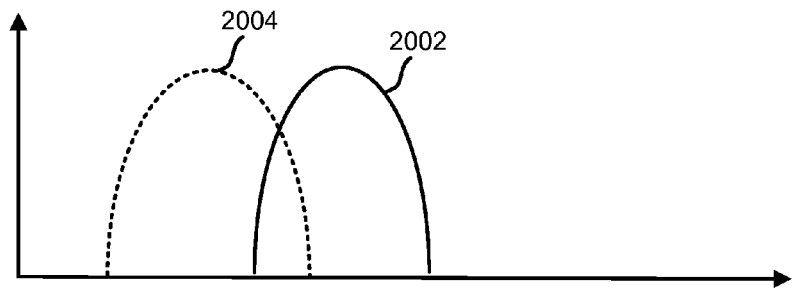
FIG. 20 shows one possible effect of the back bias on effective memory cell distributions.

FIG. 20 shows one possible effect of the back bias on effective memory cell distributions. Curve 2002 represents the effective $V_{TH}$ distribution with back bias used. Curve 2004 represents the effective $V_{TH}$ distribution with no back bias used.

Although $V_{TH}$ is raised up by back-bias effect in various verify operations, $V_{TH}$ distribution is effectively lower during the verify operation with no back bias.

This scheme of FIG. 20 has at least two advantages. First, the verify level for an intermediate state (such as the LM state) can be lower without reducing Sense Amplifier headroom margin. Second, there is no large area penalty as might occur with some negative WL schemes that need extra well isolation.

FIG. 21 shows a flowchart of one embodiment of a process 2100 of applying back bias when verifying an intermediate state. This process could be used with a wide variety of programming sequences including, but not limited to, those described in FIGS. 10A-15B. Memory cells could be programmed to two bits per cell, three bits per cell, or more bits per cell.

In step 2102, a group of non-volatile storage elements are programmed. Step 2102 includes programming the group to an intermediate state and to a final state. In one embodiment, the intermediate state is an LM state, such as depicted in FIG. 10A, 11A, 12A, or 13A, as several examples. The intermediate state could also be one or more of the states depicted in FIG. 13B, such as B', D', and F'. In one embodiment, foggy/fine programming is performed. With foggy/fine programming, the intermediate state could be one or more of the foggy states depicted in FIG. 14B or 15B. With foggy/fine programming, the intermediate state could also be the intermediate state depicted in FIG. 15A. These are all examples of the intermediate states, but step 2102 is not limited to these examples.

In one embodiment, the intermediate state is programmed when programming a lower page. In one embodiment, the intermediate state is programmed when programming a middle page. In one embodiment, the final state is programmed when programming an upper page.

There are numerous possibilities for the final state. In one embodiment, the final state is programmed directly from the intermediate state. For example, in FIG. 10B, the B- and C-state may be programmed directly from the LM state. Likewise, in FIG. 11B, the B- and C-state may be programmed directly from the LM state. In the example in FIGS. 12B and 12C, first the C-state is programmed directly from the LM state (FIG. 12B). Then, the B-state is programmed directly from the LM state (FIG. 12C), but in a different pass.

In one embodiment, the final state is programmed indirectly from the intermediate state. One such example is depicted in FIGS. 13A-13C. In FIG. 13A, the LM state is programmed. In FIG. 13B, the D'- and F'-states are programmed directly from the LM state 1360. Then, the D, E, F, and G states are programmed in FIG. 13C. Thus, the D, E, F, and G all rely on the programming of the LM state, but there is an intervening programming stage.

In one embodiment, the final state is one of the fine programming states in a foggy/fine programming process. For example, any of states 1-7 in FIG. 14C may be the final state, in one embodiment. The foregoing are examples of the final state, but the final state is not limited to these examples.

In one embodiment, the programming step 2102 involve performing the process of FIG. 7 more than once. For example, that process can be performed once to program to the intermediate state and again to program to the final state.

The group of memory cells being referred to in step 2102 may be associated with a selected word line. Note that this group are not necessarily the only memory cells on that word line undergoing programming. For example, with respect to the example of FIGS. 10A-10B, the group of memory cells may be those that are first programmed to the LM state 1050, and then to either the B- or C-state. However, other memory cells on the selected word line may be programmed to the A-state, and still others may remain erased.

Steps 2104 and 2106 represents verify steps during the programming operation of step 2102. Step 2104 includes applying a back bias when verifying the intermediate state during the programming operation. Applying the back bias effectively tests for a verify reference level associated with the intermediate state. As one example, this tests for Vvlm (see FIGS. 10A, 11A, 12A, 13A. As one example, this tests for one or more of Vvb' Vvd' Vvf' (see FIG. 13B). As another example, this tests for one or more of Vvf1-Vvf7 (see FIGS. 15B, 16B). As still another example, this tests for Vvi (see FIG. 15A).

Step 2106 includes applying less or no back bias when verifying the final state during the programming operation. Applying less or no back bias effectively tests for a verify reference level associated with the final state. As one example, this tests for one or more of Vva, Vvb, and/or Vvc (see FIG. 10B, 11B, 11C, 12B, 12C). As another example, this tests for one or more of Vva, Vvb, Vvc, Vvd, Vve, Vvf, and/or Vvg (see FIG. 13C). As another example, this tests for one or more of Vv1-Vv7 (see FIG. 14C). In one embodiment, no back bias is used in step 2106.

Note that between steps 2104 and 2106, programming may occur on one or more neighboring word lines. For example, one neighboring word line might be programmed to the intermediate state, and another neighboring word line might be programmed to the final state.

Figure 22A:
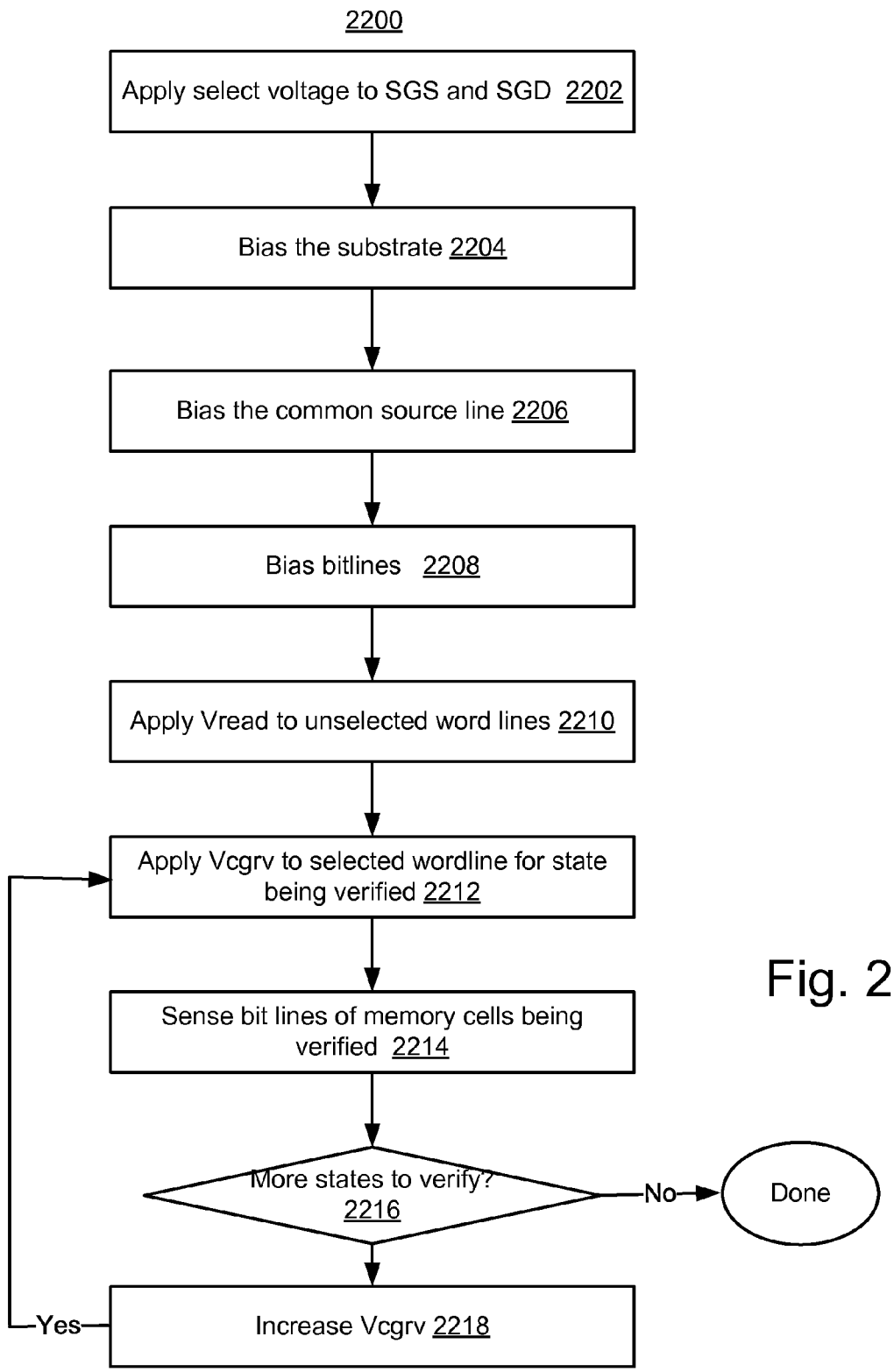
FIG. 22A is a flowchart of one embodiment of a process 2200 of verifying memory cells during a programming operation using back bias for an intermediate state.
Figure 22B:
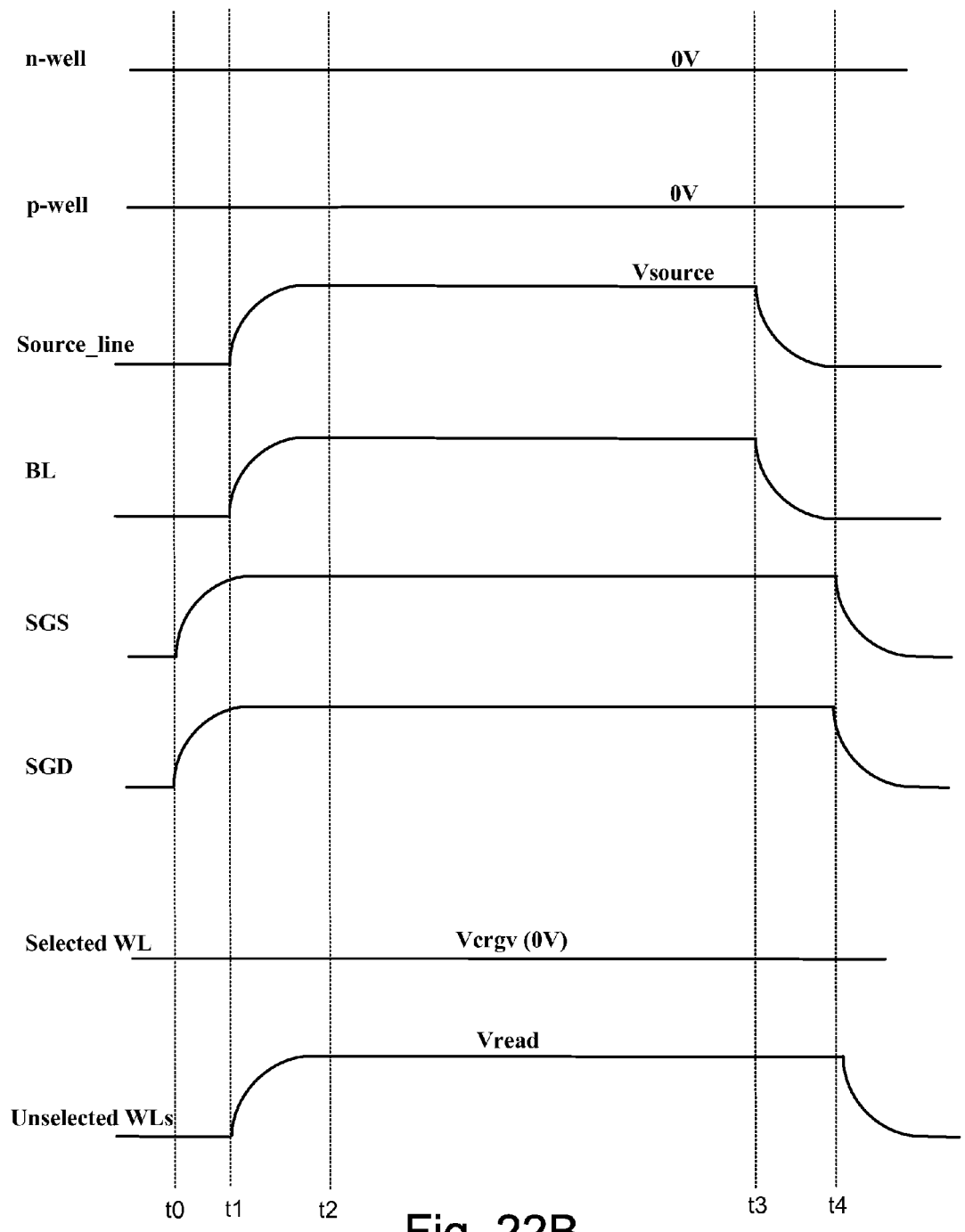
FIGS. 22B and 22C shows example signals that may be applied during process 2200.
Figure 22C:
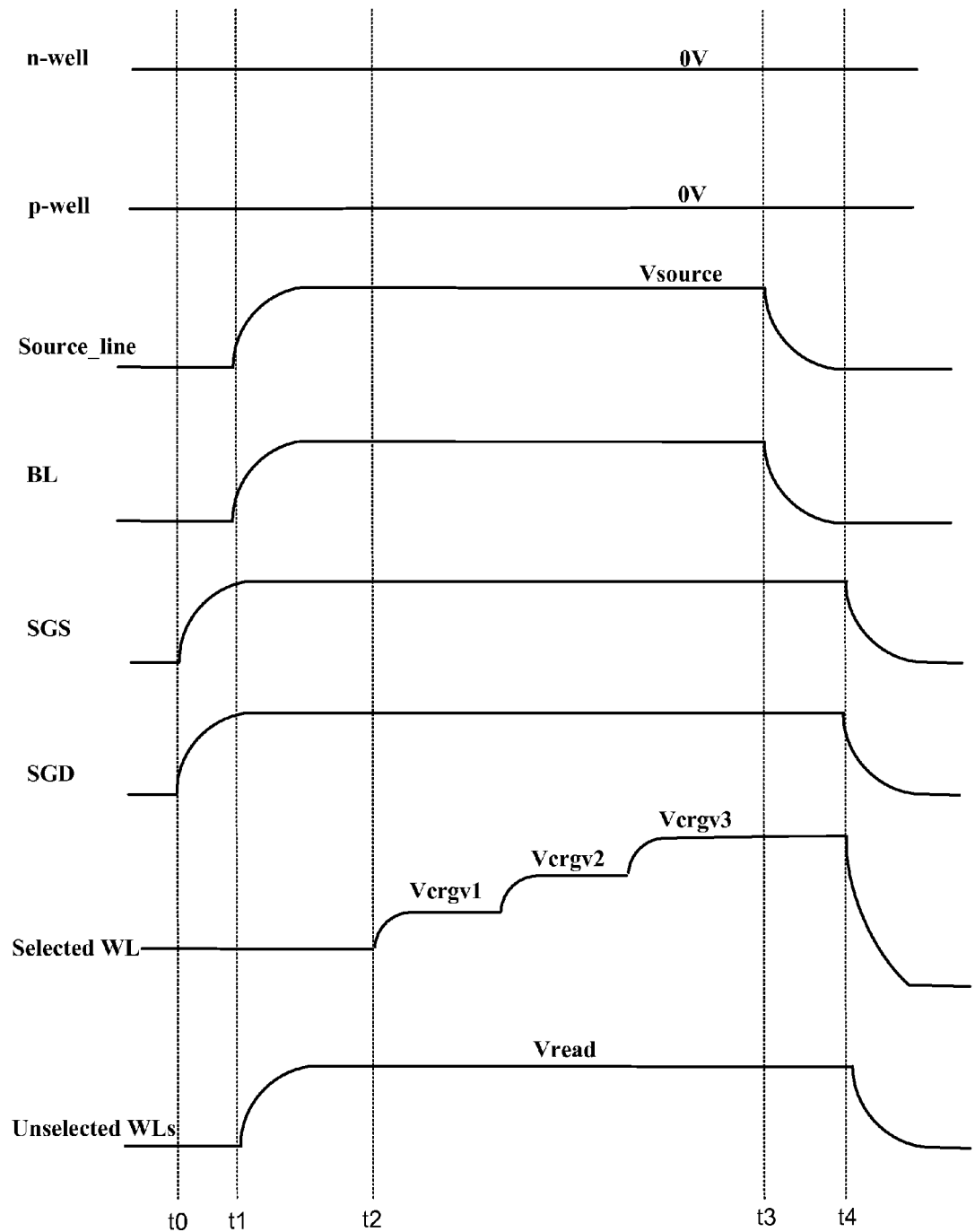

FIG. 22A is a flowchart of one embodiment of a process 2200 of verifying memory cells during a programming operation using back bias for an intermediate state. This is one embodiment of step 2104. Steps may be performed in a different order than presented. FIGS. 22B and 22C shows example signals that may be applied during process 2200. Note that the voltages in FIGS. 22B and 22C are used for illustration; other voltages could be used. Process 2200 is for an embodiment in which the memory cells are part of NAND strings.

In step 2202, voltages are applied to the source side select gate line (SGS) and the drain side select gate line (SGD). This may be a sufficient voltage to turn on the select gates after suitable voltages are applied to the common source line and bit lines.

In step 2204, the substrate is biased. As one example, the substrate is biased to 0V. Referring to FIG. 4 or 19A, biasing the substrate may include applying Vp-well to the p-well region 492, in one embodiment. Suitable voltages may be applied to the n-well 494 and the p-substrate 496 to avoid forward biasing any of the pn junctions. In FIGS. 22B and 22C, 0V is applied to both the p-well and n-well. However, both Vpwell and Vnwell can have non-zero values. In one embodiment, Vpwell is applied at least between t1 and t3. Likewise, Vnwell is applied at least between t1 and t3, in one embodiment.

In step 2206, the common source line is biased to Vsource. As an example, the source line is biased to 1.5V. Steps 2204 and 2206 serve to achieve a back bias. Herein, this may be referred to as back biasing the selected memory cell or as back biasing the NAND string. This may also be referred to as body biasing. In one embodiment, the substrate is biased to a lower voltage than the common source line. This may help to verify a lower $V_{TH}$.

In step 2208, the bit lines are biased. In one embodiment, the bit lines are biased to a higher voltage than the common source line. This allows for a current to flow from the drain side to the source side of the NAND string, if the selected memory cell conducts a current.

In step 2210, Vread is applied to unselected word lines. Vread is a voltage that should cause the memory cell to conduct a current regardless of its $V_{TH}$.

In step 2212, a suitable read reference voltage is applied to the selected word line. This read reference voltage factors in that back-biasing has been applied. Back biasing may effectively raise the $V_{TH}$ of the memory cell. This may have the effect of allowing a higher read reference voltage to be applied to the selected word line. This can avoid the need to apply a negative voltage to the selected word line. In the example of FIG. 22B, $V_{CGRV}$ is 0V at time t2. However, a non-zero $V_{CGRV}$ could be used.

Note that if the common source line was biased to a non-zero voltage this also impacts the selection of the read reference voltage. Thus, both the back bias and the common source line voltage are factors that may be considered when selecting a suitable voltage for the selected word line. One possibility is to apply 0V to the selected word line. Factoring in that the common source line is a positive voltage results in this effectively testing for a negative $V_{TH}$. However, note that there are limits as to how high the common source line voltage can be, as previously discussed. Factoring in the back-biasing results in this effectively testing for a still further negative $V_{TH}$. Note that greater than 0V could be applied to the selected word line, as one option. Also, note that the common source line is not required to be a positive voltage.

In step 2214, the bit lines associated with the NAND strings are sensed. In one embodiment, circuitry in the sense block 500 senses the bit lines. One possible sensing technique is to charge a sense capacitor prior in step 2214. Then, the sense capacitor is allowed to discharge for a pre-determined amount of time. The discharge is due to whatever NAND string current occurs as a result of applying $V_{CGRV}$ to the selected memory cell. If the voltage on the sense capacitor drops by a sufficient amount, then the memory cell is deemed to be in the conductive state, meaning that its $V_{TH}$ is less than the $V_{TH}$ being tested. Other sensing techniques could be used.

Optionally, the process can be used to test for additional states (step 2216). For example, three different states could be verified. In such a scenario, the selected word line voltage may be increased in step 2218 to test for the next state. FIG. 21C depicts one example in which multiple states are verified while applying back bias. The selected word line voltage starts at Vcgrv1 at time t2 to verify a first state. Then, it is increased to Vcgrv2 to verify a second state. Next, it is increased to Vcgrv3 to verify a third state. More or fewer than three states could be verified using back bias. In one embodiment, Vcgrv1 is 0V.

FIG. 13B depicts on possible example in which three different states may be verified. In this example, states B', D' and F' may be tested in succession by raising $V_{CGRV}$ in step 2218. Thus, the next two states may be verified with progressively higher voltages on the selected word line. Note that in this example, the same back bias is used when verifying all three states. This is not a requirement, but it may simplify circuit operation. Another option is to use less or no back bias when verifying one or both of the higher states.

Thus, the substrate voltage and the common source line voltage may be kept the same throughout, as depicted in FIG. 22C, which simplifies operation. However note that one option is to change either or both of the substrate voltage and/or the common source line voltage. For example, raising the substrate voltage with the common source line voltage fixed has the effect of reducing the amount of back bias. This could be performed instead of raising the selected word line voltage to x1, as one possibility. As another option, the reduction of back bias could be used in combination with increasing the selected word line voltage.

Figure 23:
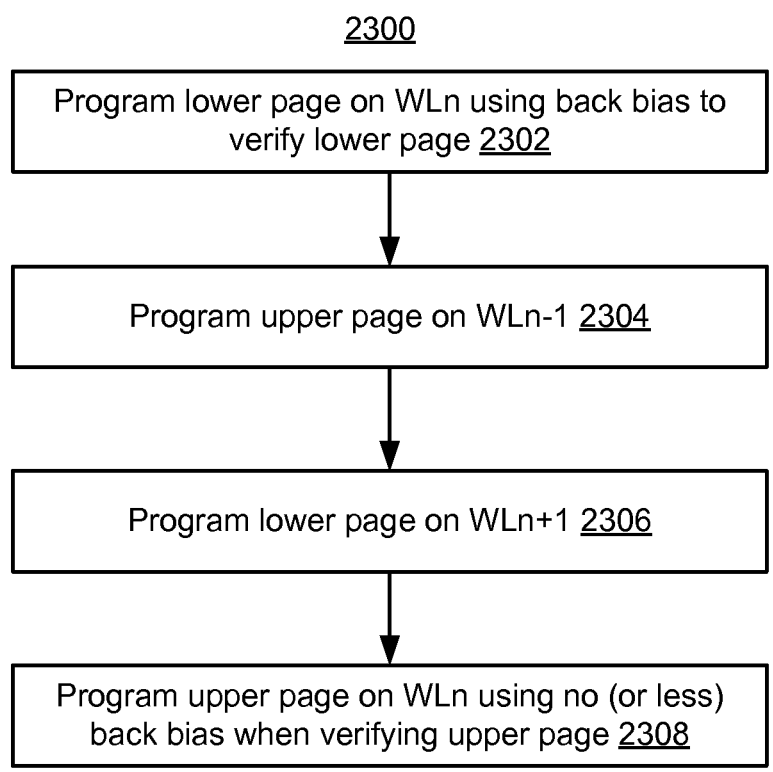
FIG. 23 is one embodiment of a process of programming a lower page and an upper page using back bias when verifying the lower page, but no back bias when verifying the upper page.

FIG. 23 is one embodiment of a process 2300 of programming a lower page and an upper page using back bias when verifying the lower page, but no back bias when verifying the upper page. In step 2302, a lower page is programmed on WLn. Back bias is used when verifying the lower page. The process of FIG. 22A can be used to apply the back bias. The back bias applies a lower voltage to the substrate than to a source end of a NAND string in one embodiment. Step 2302 is one embodiment of step 2104 in FIG. 21.

In step 2304, an upper page is programmed on WLn−1. In step 2306, a lower page is programmed on WLn+1. Programming these other pages may shift the $V_{TH}$ distribution of the lower page on WLn.

In step 2308, an upper page is programmed on WLn. No back bias is used when verifying the upper page, in one embodiment. In another embodiment, less back bias is used compared to the back bias used for verifying the lower page. Step 2308 is one embodiment of step 2106 in FIG. 21.

Many variations of the process of FIG. 23 are possible. For example, a lower, middle, and upper page can be programmed on WLn. The process can be generalized as using back bias when verifying an intermediate state (step 2302) on WLn, programming one or more neighbor word lines (step 2304 and/or 2306), and then using no (or less) back bias when verifying a final state on WLn (step 2308).

One embodiment includes a method for operating non-volatile storage, comprising the following. A group of non-volatile storage elements are programmed to an intermediate state and to a final state. A first back bias is applied to the group of non-volatile storage elements when verifying the intermediate state. Less than the first back bias or no back bias is applied to the group of non-volatile storage elements when verifying the final state.

One embodiment includes a non-volatile storage device comprising a substrate, a plurality of non-volatile storage elements formed on the substrate, a plurality of word lines associated with the plurality of non-volatile storage elements, and one or more managing circuits in communication with the substrate, the plurality of word lines, and the plurality of non-volatile storage elements. The one or more managing circuits program a group of the non-volatile storage elements that are associated with a selected word line to an intermediate state and to a final state. The one or more managing circuits apply a first back bias to the group of non-volatile storage elements when verifying the intermediate state. The one or more managing circuits less than the first back bias or no back bias to the group of non-volatile storage elements when verifying the final state.

One embodiment includes a non-volatile storage device comprising a substrate, a common source line, a plurality of bit lines, a plurality of sense amplifiers, a plurality of NAND strings of non-volatile storage elements, a plurality of word lines associated with the plurality of NAND strings, and one or more managing circuits in communication with the substrate, the plurality of word lines, and the plurality of bit lines. Each of the sense amplifiers is associated with a bit line of the plurality of bit lines. The NAND strings are formed on the substrate. A first end of each of the NAND strings is connected to the common source line. A second end of each of the NAND strings is connected to one of the bit lines. The one or more managing circuits program an intermediate page and an upper page into a group of the non-volatile storage elements that are associated with a selected word line during a programming process. The one or more managing circuits apply a first voltage to the common source line and a second voltage to the substrate when verifying the intermediate page during the programming process. The second voltage is different from the first voltage. The one or more managing circuits apply the first voltage to the common source line and the first voltage to the substrate when verifying the upper page during the programming process.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
    programming a group of non-volatile storage elements to an intermediate state and to a final state;
    applying a first back bias to the group of non-volatile storage elements when verifying the intermediate state; and
    applying less than the first back bias or no back bias to the group of non-volatile storage elements when verifying the final state.

2. The method of claim 1, wherein the applying less than the first back bias or no back bias to the group of non-volatile storage elements when verifying the final state comprises:
    applying no back bias to the group of non-volatile storage elements when verifying the final state.

3. The method of claim 1, wherein the non-volatile storage comprises a plurality of NAND strings of non-volatile storage elements and a plurality of word lines associated with the NAND strings, the plurality of NAND strings being formed in a substrate and each having a source end and a drain end, the group of non-volatile storage elements being associated with a selected word line of the plurality of word lines.

4. The method of claim 3, wherein the applying a first back bias to the group of non-volatile storage elements comprises:
    applying a first voltage to the source end of the plurality of NAND strings while applying a second voltage that is lower than the first voltage to the substrate.

5. The method of claim 4, wherein the applying less than the first back bias or no back bias to the group of non-volatile storage elements when verifying the final state comprises:
    applying the first voltage to the source end of the plurality of NAND strings.

6. The method of claim 1, wherein:
    the applying a first back bias to the group of non-volatile storage elements when verifying the intermediate state includes verifying during programming of a lower page or a middle page; and
    the applying less than the first back bias or no back bias to the group of non-volatile storage elements when verifying the final state includes verifying during programming of an upper page.

7. The method of claim 1, further comprising:
    programming a neighboring group of non-volatile storage elements between the programming the group of non-volatile storage elements to the intermediate state and the programming the group of non-volatile storage elements to the final state.

8. The method of claim 1, wherein:
    the applying a first back bias to the group of non-volatile storage elements when verifying the intermediate state includes verifying during a foggy program operation; and
    the applying less than the first back bias or no back bias to the group of non-volatile storage elements when verifying the final state includes verifying during a fine program operation.

9. A non-volatile storage device comprising:
    a substrate;
    a plurality of non-volatile storage elements formed on the substrate;
    a plurality of word lines associated with the plurality of non-volatile storage elements; and
    one or more managing circuits in communication with the substrate, the plurality of word lines, and the plurality of non-volatile storage elements, the one or more managing circuits program a group of the non-volatile storage elements that are associated with a selected word line to an intermediate state and to a final state, the one or more managing circuits apply a first back bias to the group of non-volatile storage elements when verifying the intermediate state, the one or more managing circuits apply less than the first back bias or no back bias to the group of non-volatile storage elements when verifying the final state.

10. The non-volatile storage device of claim 9, wherein the plurality of non-volatile storage elements are arranged as a plurality of NAND strings formed in the substrate, each of the NAND strings having a source end and a drain end, to apply the first back bias the one or more managing circuits apply a lower voltage to the substrate than is applied to the source end of the NAND strings.

11. The non-volatile storage device of claim 10, wherein the one or more managing circuits apply the same voltage to the substrate and to the source end of the NAND strings when verifying the final state.

12. The non-volatile storage device of claim 9, wherein the one or more managing circuits verify the intermediate state while the one or more managing circuits program a lower page or a middle page, the one or more managing circuits verify the final state while the one or more managing circuits program an upper page.

13. The non-volatile storage device of claim 9, wherein the one or more managing circuits verify the intermediate state while the one or more managing circuits perform a foggy program operation, the one or more managing circuits verify the final state while the one or more managing circuits perform a fine program operation.

14. The non-volatile storage device of claim 9, wherein the one or more managing circuits
    program a group of non-volatile storage elements that are associated with a neighbor word line between when the one or more managing circuits program the group of non-volatile storage elements to the intermediate state when the one or more managing circuits program the group of non-volatile storage elements to the final state.

15. The non-volatile storage device of claim 9, wherein the plurality of non-volatile storage elements have charge trapping layers, the one or more managing circuits store charge in the charge trapping layers to program the non-volatile storage elements.

16. The non-volatile storage device of claim 9, wherein the plurality of non-volatile storage elements have floating gates, the one or more managing circuits store charge in the floating gates to program the non-volatile storage elements.

17. A non-volatile storage device comprising:
a substrate;
a common source line;
a plurality of bit lines;
a plurality of sense amplifiers, each of the sense amplifiers associated with a bit line of the plurality of bit lines;
a plurality of NAND strings of non-volatile storage elements, the NAND strings being formed on the substrate, a first end of each of the NAND strings connected to the common source line, a second end of each of the NAND strings connected to one of the bit lines;
a plurality of word lines associated with the plurality of NAND strings; and
one or more managing circuits in communication with the substrate, the plurality of word lines, and the plurality of bit lines, the one or more managing circuits program an intermediate page and an upper page into a group of the non-volatile storage elements that are associated with a selected word line during a programming process, the one or more managing circuits apply a first voltage to the common source line and a second voltage to the substrate when verifying the intermediate page during the programming process, the second voltage is different from the first voltage, the one or more managing circuits apply the first voltage to the common source line and the first voltage to the substrate when verifying the upper page during the programming process.

18. The non-volatile storage device of claim 17, wherein the second voltage is lower than the first voltage.

19. The non-volatile storage device of claim 17, wherein the plurality of sense amplifiers sense a condition of their respective bit lines when verifying the intermediate page during the programming process and when verifying the upper page during the programming process.

20. The non-volatile storage device of claim 17, wherein the intermediate page is either a lower page or a middle page.

* * * * *